(12) United States Patent
Meiser et al.

(10) Patent No.: US 10,205,016 B2
(45) Date of Patent: Feb. 12, 2019

(54) METHOD FOR MANUFACTURING AN INTEGRATED CIRCUIT INCLUDING A LATERAL TRENCH TRANSISTOR AND A LOGIC CIRCUIT ELEMENT

(71) Applicant: Infineon Technologies AG, Neubiberg (DE)

(72) Inventors: Andreas Meiser, Sauerlach (DE); Till Schloesser, München (DE); Detlef Weber, Ottendorf-Okrilla (DE); Karl-Heinz Gebhardt, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/484,206

(22) Filed: Apr. 11, 2017

(65) Prior Publication Data

US 2017/0301791 A1    Oct. 19, 2017

(30) Foreign Application Priority Data

Apr. 13, 2016 (DE) .......................... 10 2016 106 872

(51) Int. Cl.
| | |
|---|---|
| *H01L 29/66* | (2006.01) |
| *H01L 29/78* | (2006.01) |
| *H01L 27/088* | (2006.01) |
| *H01L 29/417* | (2006.01) |

(Continued)

(52) U.S. Cl.
CPC .. *H01L 29/7825* (2013.01); *H01L 21/823418* (2013.01); *H01L 27/088* (2013.01);
(Continued)

(58) Field of Classification Search
CPC ............... H01L 29/7825; H01L 27/088; H01L 29/41758; H01L 29/66704; H01L 21/265; H01L 21/26586

See application file for complete search history.

(56) References Cited

U.S. PATENT DOCUMENTS

| | | |
|---|---|---|
| 6,118,149 A | 9/2000 | Nakagawa et al. |
| 8,847,311 B2 | 9/2014 | Meiser et al. |

(Continued)

FOREIGN PATENT DOCUMENTS

| | | |
|---|---|---|
| DE | 102014113741 A1 | 4/2015 |
| DE | 102015106683 A1 | 11/2016 |

*Primary Examiner* — Dale E Page
*Assistant Examiner* — Wasiul Haider
(74) *Attorney, Agent, or Firm* — Murphy, Bilak & Homiller, PLLC

(57) ABSTRACT

A method of forming an integrated circuit includes forming gate trenches in the first main surface of a semiconductor substrate, the gate trenches being formed so that a longitudinal axis of the gate trenches runs in a first direction parallel to the first main surface. The method further includes forming a source contact groove running in a second direction parallel to the first main surface, the second direction being perpendicular to the first direction, the source contact groove extending along the plurality of gate trenches, forming a source region including performing a doping process to introduce dopants through a sidewall of the source contact groove, and filling a sacrificial material in the source contact groove. The method also includes, thereafter, forming components of the logic circuit element, thereafter, removing the sacrificial material from the source contact groove, and filling a source conductive material in the source contact groove.

20 Claims, 26 Drawing Sheets

(51) Int. Cl.
  *H01L 21/8234* (2006.01)
  *H01L 21/265* (2006.01)
  *H01L 29/40* (2006.01)
  *H01L 29/10* (2006.01)
  *H01L 27/06* (2006.01)
  *H01L 27/092* (2006.01)
(52) U.S. Cl.
  CPC .. *H01L 29/41758* (2013.01); *H01L 29/41766* (2013.01); *H01L 29/66659* (2013.01); *H01L 29/66696* (2013.01); *H01L 29/66704* (2013.01); *H01L 29/7835* (2013.01); *H01L 21/26586* (2013.01); *H01L 27/0623* (2013.01); *H01L 27/0922* (2013.01); *H01L 29/1095* (2013.01); *H01L 29/404* (2013.01); *H01L 29/407* (2013.01)

(56) References Cited

U.S. PATENT DOCUMENTS

| | | | |
|---|---|---|---|
| 9,006,811 B2 | 4/2015 | Meiser et al. | |
| 2001/0045578 A1* | 11/2001 | Hueting | H01L 29/0634 257/216 |
| 2011/0306172 A1* | 12/2011 | Denison | H01L 29/42368 438/270 |
| 2013/0256791 A1 | 10/2013 | Iguchi et al. | |
| 2014/0035047 A1* | 2/2014 | Korec | H01L 27/0629 257/368 |
| 2014/0151798 A1 | 6/2014 | Meiser et al. | |
| 2014/0319602 A1* | 10/2014 | Vielemeyer | H01L 29/66477 257/330 |
| 2015/0102404 A1 | 4/2015 | Hirler et al. | |

\* cited by examiner

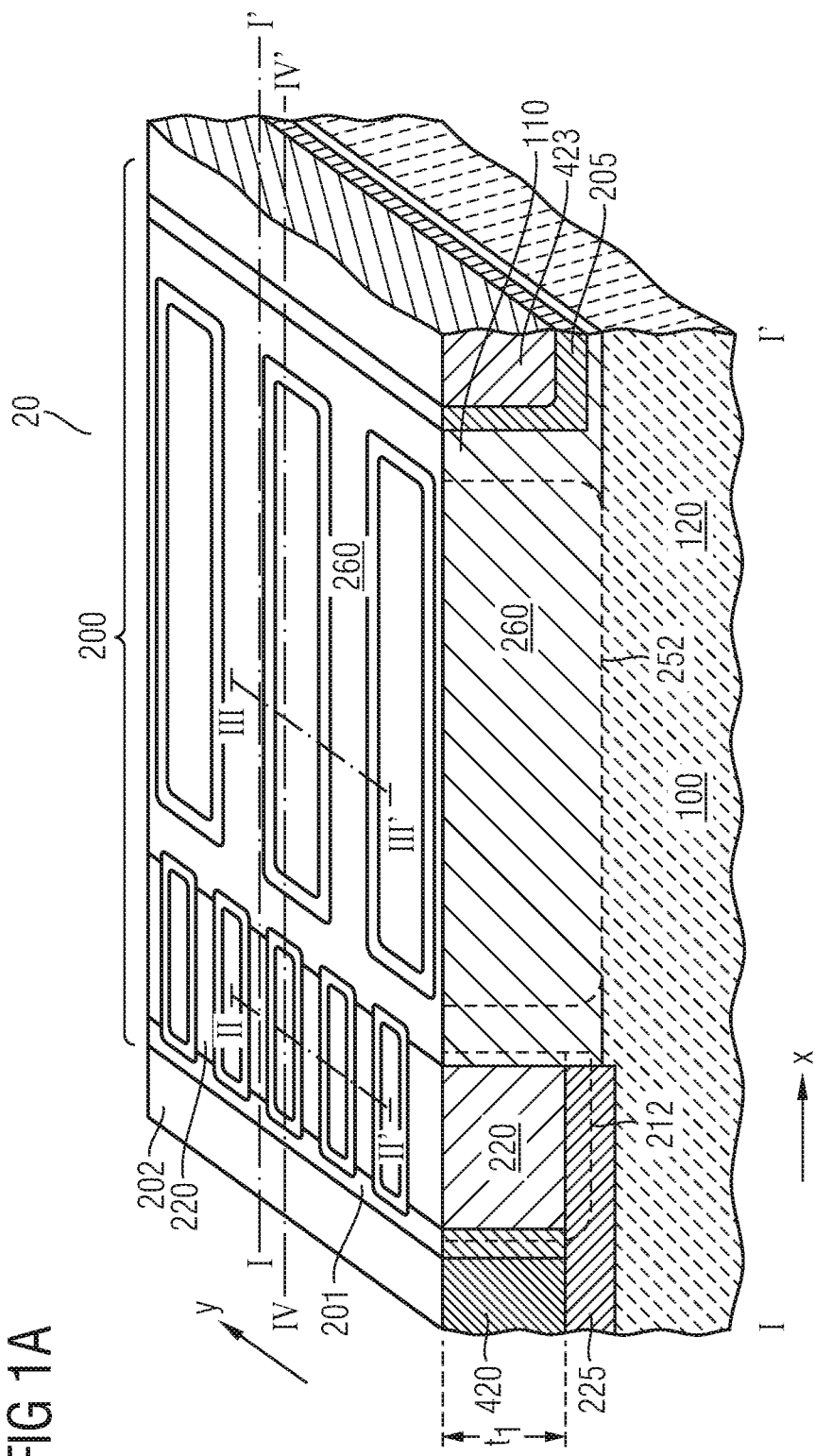

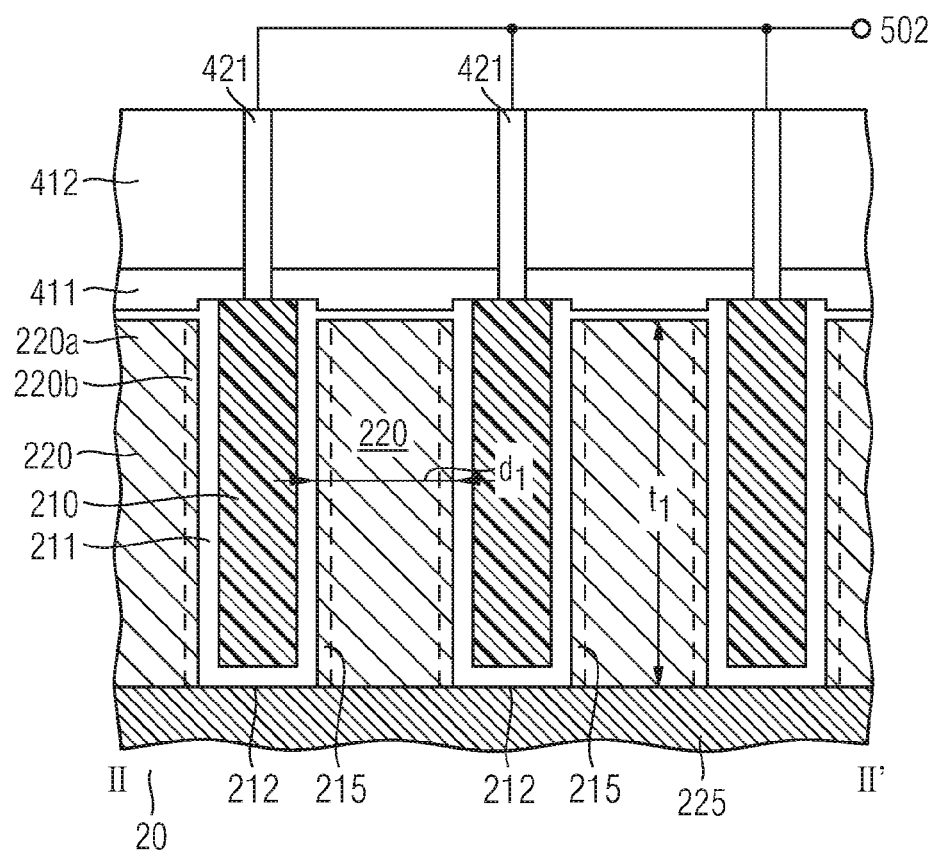

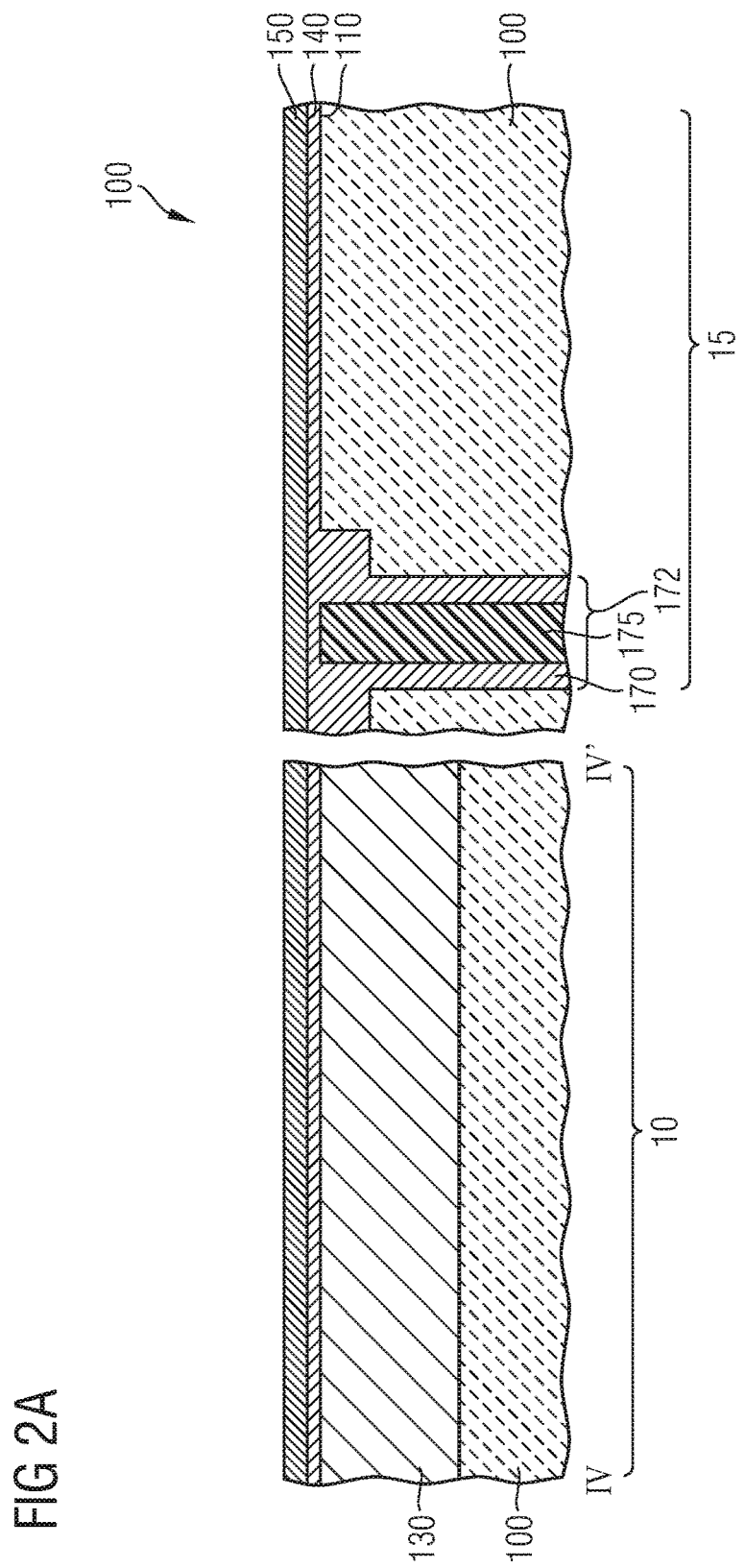

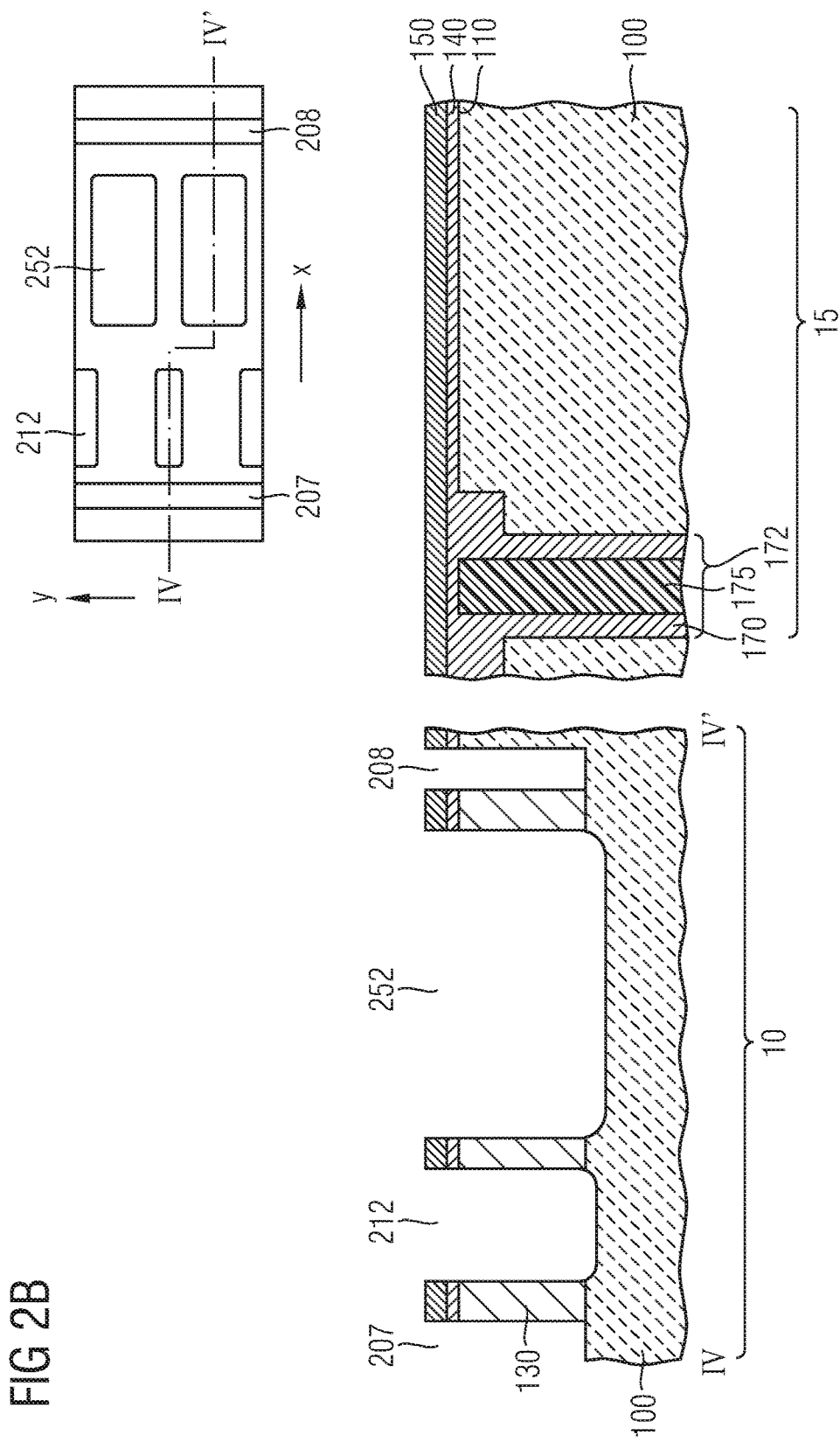

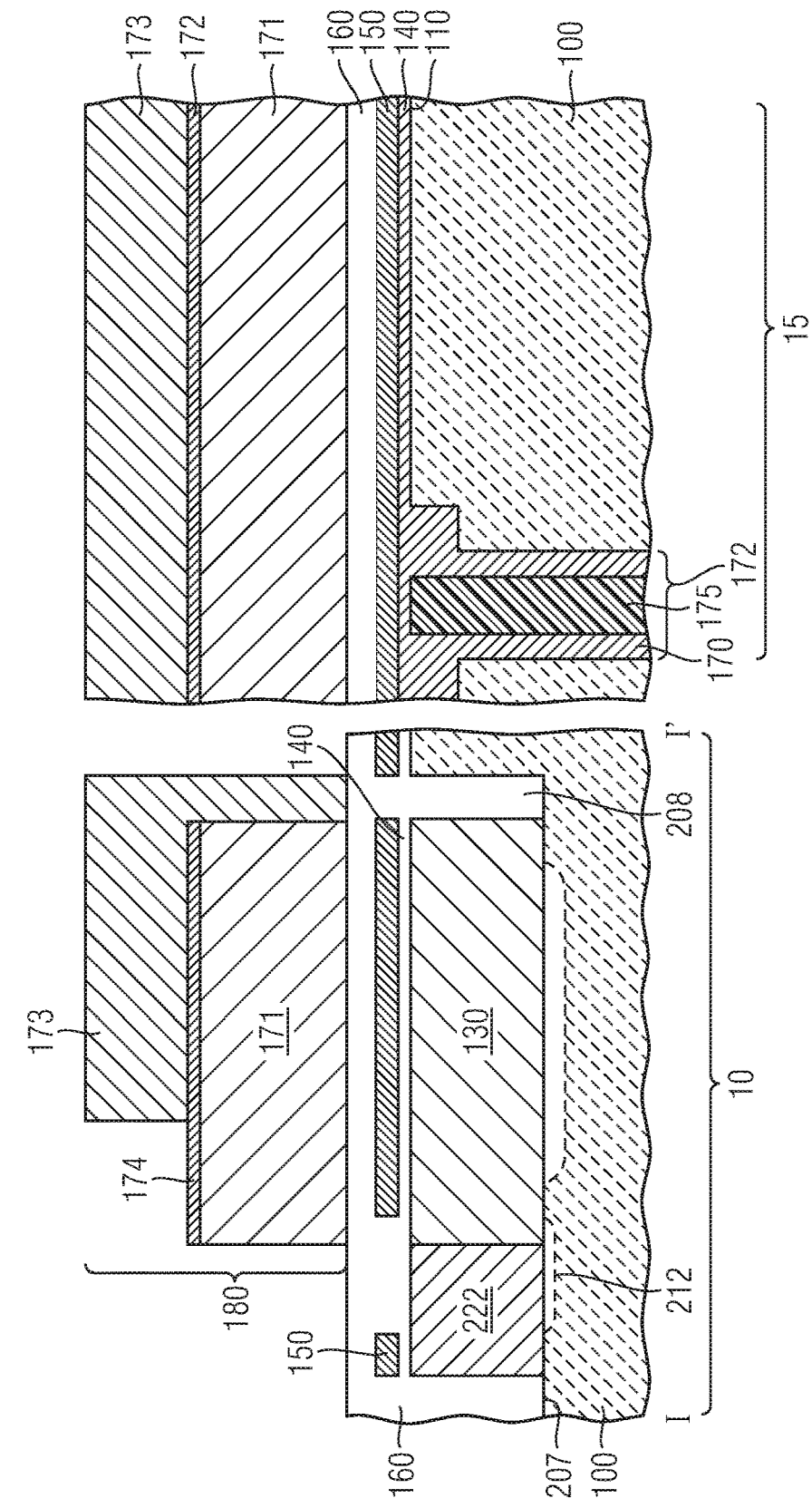

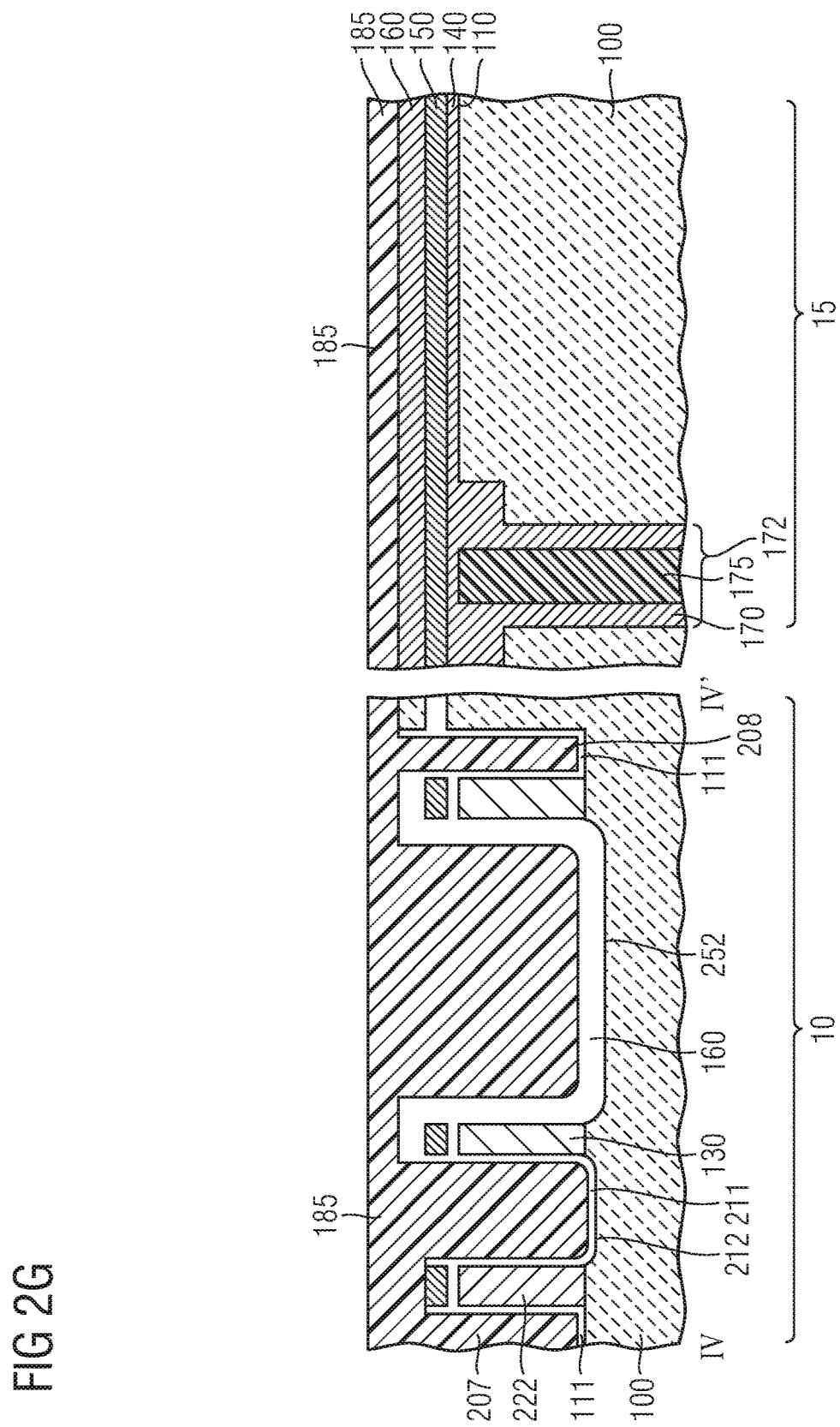

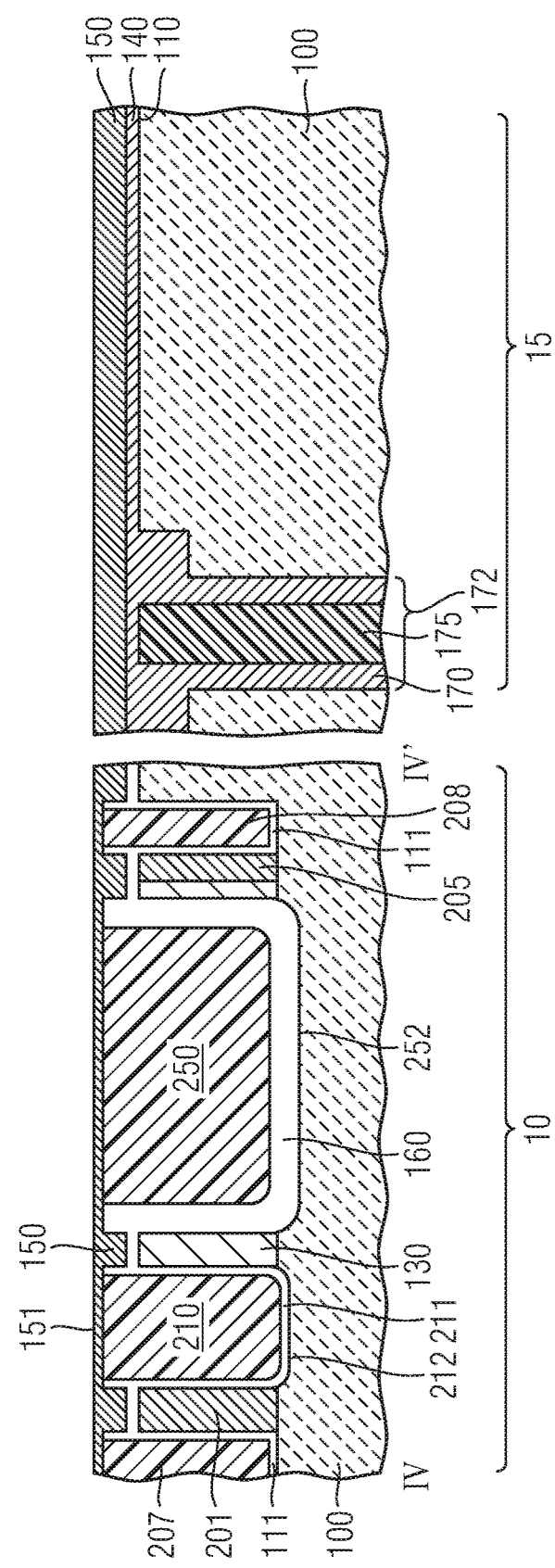

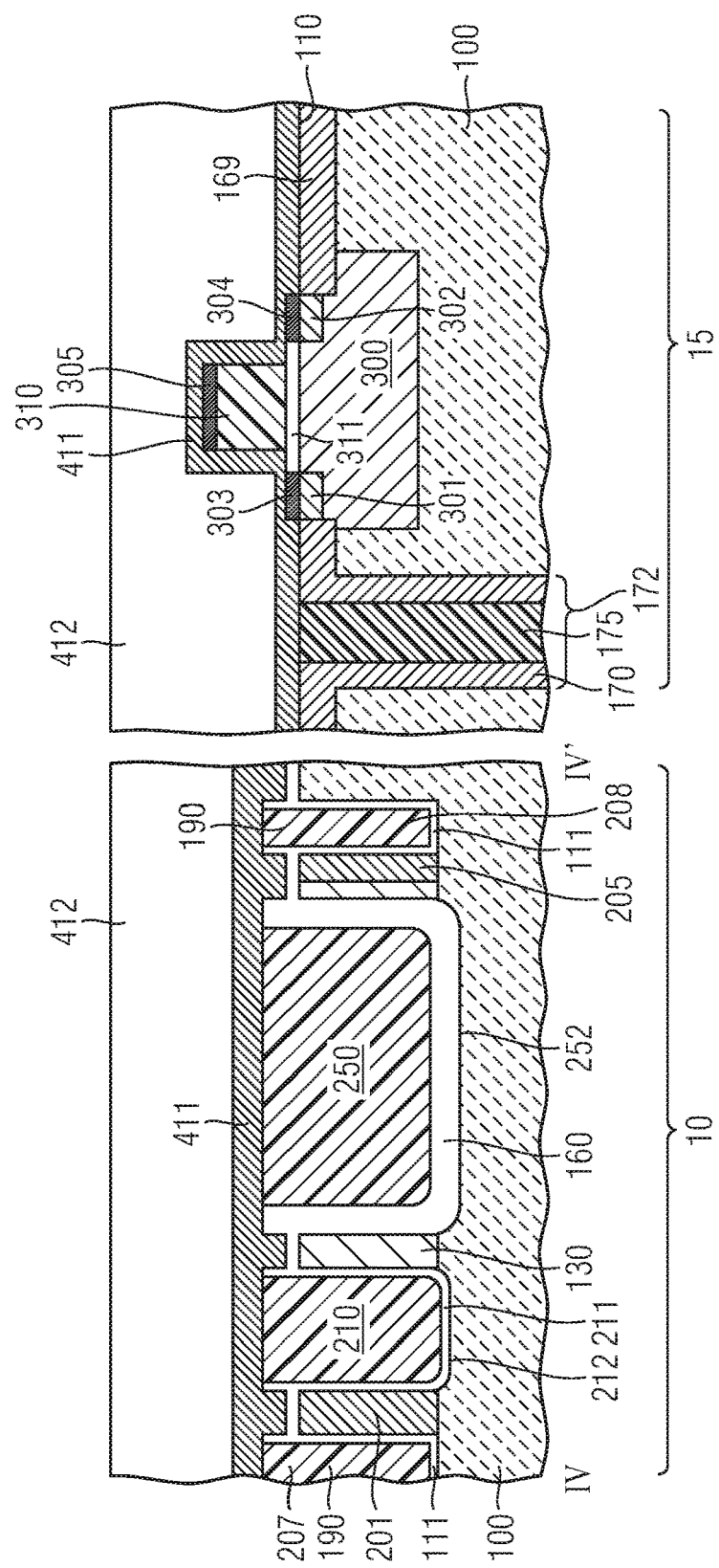

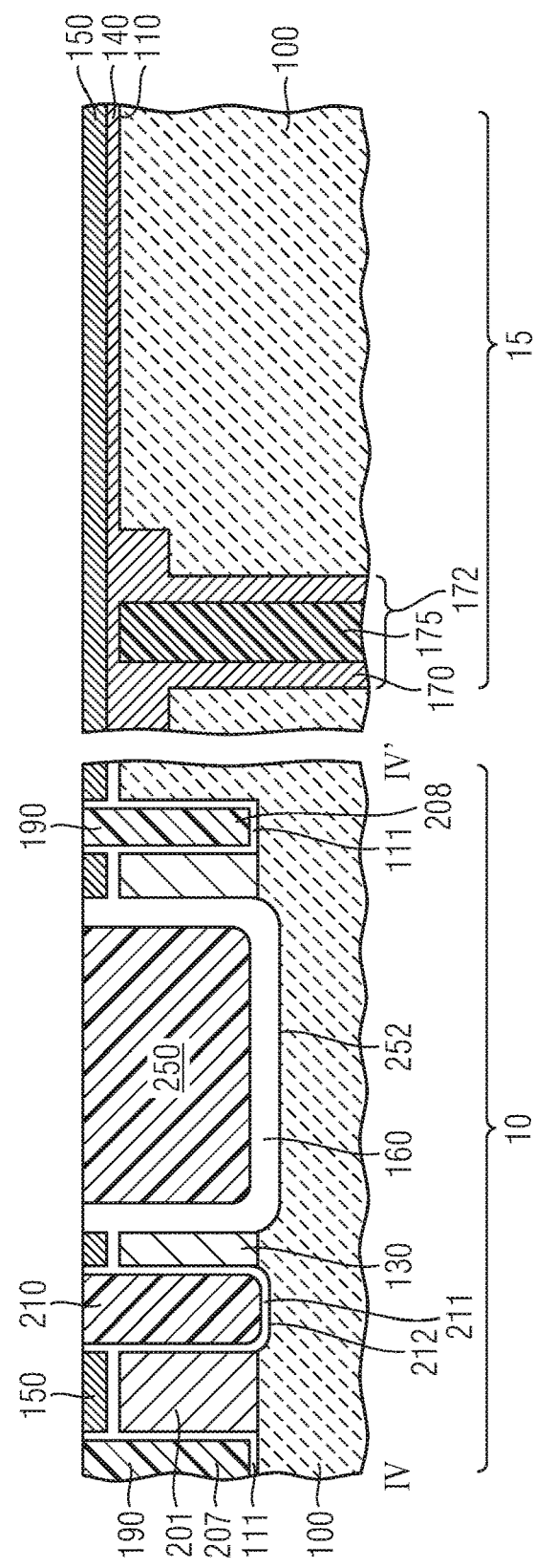

METHOD FOR MANUFACTURING AN INTEGRATED CIRCUIT INCLUDING A LATERAL TRENCH TRANSISTOR AND A LOGIC CIRCUIT ELEMENT

BACKGROUND

Power transistors commonly employed in automotive and industrial electronics require a low on-state resistance (Ron A), while securing a high voltage blocking capability. For example, a MOS ("metal oxide semiconductor") power transistor should be capable, depending upon application requirements, to block drain to source voltages Vds of some tens to some hundreds or thousands of volts. MOS power transistors typically conduct very large currents which may be up to some hundreds of Amperes at typical gate-source voltages of about 2 to 20 V. Low-voltage power transistors are applied in a drain to source voltage range Vds below 10 Volts.

Lateral power devices, in which a current flow mainly takes place parallel to a first main surface of a semiconductor substrate, are useful for integrated circuits in which further components, such as switches, bridges and control circuits are integrated. Generally, transistors are being investigated which may be used as a low-resistive low-voltage power switch and which may be integrated with a driver circuit.

Concepts for integrating logic circuits, analogue circuits and power transistors in one chip are being developed. In these devices, the single components have to be insulated from each other so that they will not mutually affect the functionality thereof. In particular, methods are being investigated by which the components of the single circuits may be formed by common processing methods.

Accordingly, it is an object of the present invention to provide an improved method for forming an integrated circuit, the method having a reduced complexity. Further, it is an object to provide a corresponding integrated circuit.

SUMMARY

According to an embodiment, a method of forming an integrated circuit including a lateral trench transistor and a logic circuit element, comprises forming a plurality of gate trenches in a first main surface of a semiconductor substrate, wherein a longitudinal axis of the gate trenches runs in a first direction parallel to the first main surface. The method further comprises forming a source contact groove running in a second direction parallel to the first main surface, the second direction being perpendicular to the first direction, the source contact groove extending along the plurality of gate trenches, and forming a source region comprising performing a doping process by introducing dopants through a sidewall of the source contact groove. The method further comprises filling a sacrificial material in the source contact groove, thereafter, forming components of the logic circuit element, thereafter, removing the sacrificial material from the source contact groove; and filling a source conductive material in the source contact groove.

According to an embodiment, a method of forming an integrated circuit including a lateral trench transistor and a logic circuit element, comprises forming a plurality of gate trenches in a first main surface of a semiconductor substrate, wherein a longitudinal axis of the gate trenches runs in a first direction parallel to the first main surface, forming a drain contact groove running in a second direction parallel to the first main surface, the second direction being perpendicular to the first direction, the drain contact groove extending along the plurality of gate trenches. The method further comprises forming a drain region comprising performing a doping process by introducing dopants of a first conductivity type through a sidewall of the source contact groove, filling a sacrificial material in the drain contact groove, and, thereafter, forming components of the logic circuit element. The method comprises, thereafter, removing the sacrificial material from the drain contact groove, and filling a source conductive material in the drain contact groove.

According to an embodiment, a semiconductor device comprises an array of transistor cells, each of the transistor cells being formed in a semiconductor substrate having a first main surface and including a body region disposed between a source region and a drain region, and gate trenches arranged on opposite sides of the body region, a longitudinal axis of the gate trenches running in a first direction parallel to the first main surface. The source region, the body region, and the drain region are arranged along the first direction. The semiconductor device further comprises gate electrodes arranged in the gate trenches, respectively, and gate contacts, each for connecting one of the gate electrodes to a gate terminal, the gate contacts being spatially separate from each other.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIG. 1A shows a perspective view of a portion of an integrated circuit according to an embodiment.

FIG. 1B shows a cross-sectional view of a portion of the integrated circuit according to an embodiment.

FIGS. 2A-2I illustrate cross-sectional views of a workpiece when performing the method for manufacturing an integrated circuit according to an embodiment.

FIGS. 3A-3G show cross-sectional views of a workpiece when performing further steps for manufacturing the integrated circuit according to an embodiment.

FIGS. 4A-4E show cross-sectional views of a workpiece when performing steps for manufacturing components of an integrated circuit according to a modification.

DETAILED DESCRIPTION

Figure 2C:
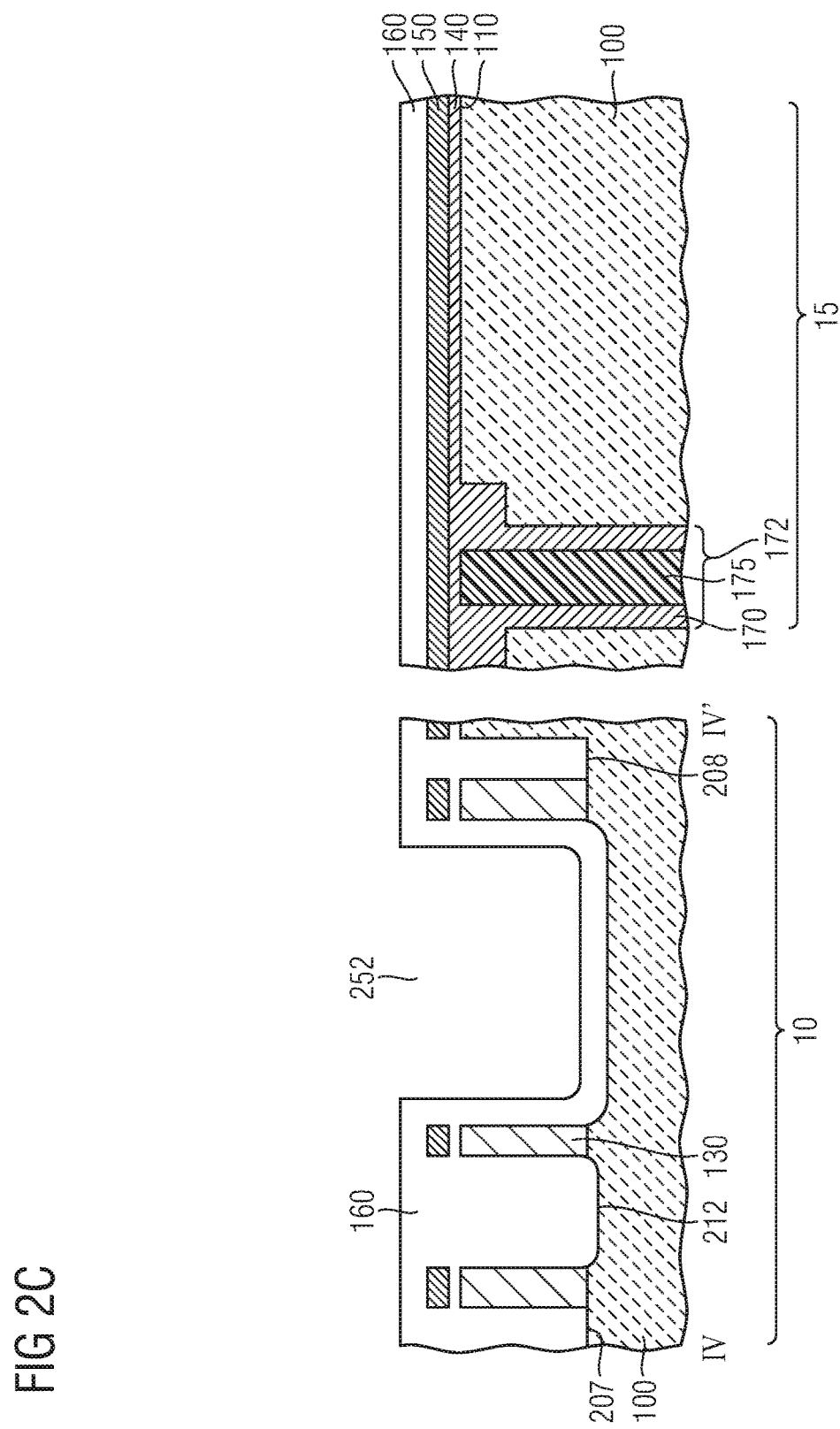

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The Figures and the description illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

The present specification refers to a "first" and a "second" conductivity type of dopants, semiconductor portions are doped with. The first conductivity type may be p type and the second conductivity type may be n type or vice versa. As is generally known, depending on the doping type or the polarity of the source and drain regions, insulated gate field effect transistors (IGFETs) such as metal oxide semiconductor field effect transistors (MOSFETs) may be n-channel or p-channel MOSFETs. For example, in an n-channel MOSFET, the source and the drain region are doped with n-type dopants. In a p-channel MOSFET, the source and the drain region are doped with p-type dopants. As is to be clearly understood, within the context of the present specification, the doping types may be reversed. If a specific current path is described using directional language, this description is to be merely understood to indicate the path and not the polarity of the current flow, i.e. whether the current flows from source to drain or vice versa. The Figures may include polarity-sensitive components, e.g. diodes. As is to be clearly understood, the specific arrangement of these polarity-sensitive components is given as an example and may be inverted in order to achieve the described functionality, depending whether the first conductivity type means n-type or p-type.

FIG. 1A shows a perspective view of a portion of the integrated circuit according to an embodiment. FIG. 1A shows a semiconductor device 20 comprising an array of transistor cells 200 formed in a semiconductor substrate 100 having a first main surface 110. The array of transistor cells 200 comprises a source region 201 and a drain region 205. Each of the transistor cells 200 comprises a body region 220 that is disposed between the source region 201 and the drain region 205. The source region 201, the body region 220 and the drain region 205 are arranged along a first direction parallel to the first main surface of the semiconductor substrate 100, e.g. the x-direction.

The semiconductor device 20 comprises gate trenches 212. A longitudinal axis of the gate trenches 212 runs in the first direction. The gate trenches 212 are disposed on opposite sides of the body region 220. Throughout the semiconductor device 20, the distance between adjacent gate trenches 212 may be constant or may vary. The number of gate trenches 212 and, thus, the distance between adjacent gate trenches 212 may be selected in accordance with the requirements. The term "lateral trench transistor" generally refers to a transistor comprising a gate electrode 210 in a gate trench 212 in a semiconductor substrate 100. The gate electrode 210 of a lateral trench transistor is configured to control a conductivity of a current flow in a lateral or horizontal direction. For example, the source region 201, the body region 220 and the drain region 205 of the lateral trench transistor may be arranged along a horizontal direction. According to an embodiment, the distance between adjacent gate trenches 212 may be smaller than a width of the gate trenches 212. In this case, the body region 220 may be patterned by adjacent gate trenches 212 into a plurality of ridges and the lateral trench transistor may implement a FinFET. The ridges into which the body region 220 is patterned, extend in the first direction. According to a further embodiment, the distance between adjacent gate trenches 212 may be larger than the width of the gate trenches 212.

Gate electrodes of the single transistor cells are disposed in each of the gate trenches 212. The array of transistors further may comprise a source contact 420 which is arranged in a source contact groove 207. The device further may comprise a drain contact 423 which is disposed in a drain contact groove 208. The gate electrodes 210 assigned to the respective transistor cells 200 are connected via single gate contacts 421 to a gate terminal 502. The transistor cells may further comprise a body contact portion 225 which may be disposed beneath the source contact groove 207. According to further embodiments, the body contact portion 225 may be disposed at a sidewall of the source contact groove 207. The body contact portions 225 and the source region 201 may be alternatingly disposed. The body contact portion is configured to electrically connect the body region 220 with the source contact 202. The body contact portion 225 avoids or deteriorates a parasitic bipolar transistor which could otherwise be formed.

The transistor cells 200 further may comprise a drift zone 260 which is disposed between the body region 220 and the drain region 205. Further, the transistor cells 200 may comprise a field plate 250. According to the embodiment shown in FIG. 1, the field plate 250 may be arranged in field plate trenches 252. The field plate trenches 252 may extend in the first direction and may be disposed on opposite sides of the drift zone 260. For example, the source region 201 and the drain region 205 may be of the first conductivity type, e.g. n-type. The body region 220 may be of the second conductivity type, e.g. p-type. The drift zone 260 may be of the first conductivity type at a lower doping concentration than the source and the drain regions 201, 205. The body contact portion 225 may be of the second conductivity type at a higher doping concentration than the body region 220.

FIG. 1B shows a cross-sectional view of a component of the semiconductor device 20 which may be taken between II and II'. The cross-sectional view of FIG. 1B may be taken so as to intersect a plurality of gate electrodes 210 of adjacent transistor cells 200. As is illustrated, gate trenches 212 may be disposed on opposite sides of the body regions 220. The body regions 220 comprise a top surface 220a and sidewalls 220b. The gate electrode 210 is disposed adjacent to the sidewalls 220b of the body regions. A gate dielectric layer 211 is disposed between the sidewall 220b of the body regions and the gate electrode 210.

When the transistor is switched on, e.g. by applying a suitable voltage to the gate electrode 210, a conductive inversion layer 215 is formed at the boundary between the body region 220 and the gate dielectric 211. Accordingly, the transistor is in a conducting state from the source region 201 to the drain region 205. In case of switching off, no conductive inversion layer is formed and the transistor is in a non-conducting state. The single gate electrodes 210 which are assigned to respective body regions 220 are connected via gate contacts 421 to a gate terminal 502. An insulating layer 411 is disposed adjacent to the top side 220a of each of the body regions 220. In more detail, the gate electrode 210 is absent from a horizontal portion disposed over the top side 220a of the body region 220.

According to an embodiment, the width d1 of the body region 220 is d1>2×ld, wherein ld denotes a length of a depletion zone which is formed at the interface between the gate dielectric layer 211 and the body region 220. Generally, it is assumed that in a transistor, the length of the depletion zone at a gate voltage corresponding to the threshold voltage corresponds to the maximum width of the depletion zone. For example, the width of the depletion zone may be determined as:

$$l_d = \sqrt{\frac{4\varepsilon_s kT\ln(N_A/n_i)}{q^2 N_A}}$$

wherein $\varepsilon_s$ denotes the permittivity of the semiconductor material ($11.9*\varepsilon_0$ for silicon), k denotes the Boltzmann constant ($1.38066*10^{-23}$ J/K), T denotes the temperature, e.g. 293K, ln denotes the natural logarithm, $N_A$ denotes the impurity concentration of the semiconductor body, $n_i$ denotes the intrinsic carrier concentration ($1.45*10^{10}$ for silicon at 27° C.), q denotes the elementary charge ($1.6*10^{-19}$ C).

In particular, the depletion zones formed at opposing sidewalls 220b of a body region 220 may not merge with each other so that the body region 220 may be connected to the body contact portion 225 along the entire length of the body region 220. For example, the width of the trenches may be approximately 20 to 1000 nm, for example, more than 200 nm along the first main surface 110 of the semiconductor substrate 100. Further, the distance between adjacent trenches that corresponds to the width d1 of the body regions may be larger than 100 nm, for example more than 130 nm, e.g. even more than 200, 300, 400 or 500 nm. According to a further embodiment, the width d1 of the body region may be d1<2×ld, wherein ld denotes the length of a depletion zone which is formed at the interface between the gate dielectric layer 211 and the body region 220. In this case, the channel regions formed in the body regions 220 at opposing sidewalls 220b of a body region may physically contact each other, when, for example, a voltage corresponding to the threshold voltage is applied to the gate terminal. According to the embodiment the body region 220 may fully depleted when the gate electrode is set to an appropriate potential. Such a transistor is also referred to as a "fully depleted" transistor. In such a transistor, an optimal sub-threshold voltage can be achieved and short channel effects may be efficiently suppressed, resulting in improved device characteristics. According to this embodiment, the width of the body region 220 may be approximately 20 to 130 nm, e.g. 40 to 120 nm along the second direction and parallel to the first main surface 110 of the semiconductor substrate 100.

For manufacturing an integrated circuit comprising a lateral trench transistor such as shown in FIGS. 1A and 1B and a logic circuit element, a semiconductor substrate 100 may be processed so as to comprise a lateral trench transistor portion 10 and a logic circuit portion 15. For example, isolation trenches 172 comprising an insulating liner layer 170 and a conductive or insulating filling 175 may be formed. Further, shallow trench isolation regions may be formed and further components may be defined in the logic circuit portion. Further, doping processes may be performed, e.g. in the lateral trench transistor portion 10. For example, a first doped portion 130 which may be of the first conductivity type, e.g. n-type may be defined in an upper portion of the semiconductor substrate 100. Thereafter, a silicon oxide layer 140 is formed over the first main surface 110 of the semiconductor substrate, optionally followed by a silicon nitride layer 150. Silicon oxide layer 140 and silicon nitride layer 150 may protect the logic circuit portion 15 during the next processing steps.

FIG. 2A shows an example of a resulting structure. The cross-sectional views of FIG. 2A and subsequent Figures are taken to intersect the lateral trench transistor between IV and IV' as is also shown in FIG. 1A unless indicated otherwise.

The next Figures show the formation of elements of the lateral trench transistor.

Gate trenches 212, a source contact groove 207 and a drain contact groove 208 are formed in the first main surface of the semiconductor substrate 100. Optionally, also field plate trenches 252 may be defined in the first main surface 110 of the semiconductor substrate 100. For example, this may be accomplished by forming a hard mask layer (stack) over the semiconductor substrate or workpiece and by photolithographically patterning the hard mask layer (stack). The insert in the right upper portion of FIG. 2B shows an example of a layout of gate trenches 212, source contact groove 207, drain contact groove 208 and, optionally field plate trenches 252. The insert in the right upper portion of FIG. 2B also indicates the position of cross-sectional views taken between IV and IV'. Since the number of gate trenches 212 of FIG. 2B is less than the number of gate trenches 212 shown in FIG. 1A, and the gate trenches are arranged at a position disposed between adjacent field plate trenches 252, the cross-section view between IV and IV' may be taken along an angled path as shown in the insert. These elements may be formed in the lateral trench transistor portion 10, whereas the logic circuit portion 15 is protected by the hard mask layer. After defining the structures in the hard mask layer, an etching process is performed so as to etch the gate trenches 212, the source contact groove 207, the drain contact groove 208, and, optionally, the field plate trenches 252. For example, this may be accomplished by a common or joint processing step. Due to the larger width of the field plate trenches 252, the field plate trenches may be etched at a higher etching rate resulting in a deeper depth of the field plate trenches 252. Thereafter, the remaining portion of the hard mask is removed from the surface of the silicon nitride layer 150.

FIG. 2B shows an example of a resulting structure. Thereafter, a field oxide layer 160 may be formed over the semiconductor substrate. For example, a method of forming a field oxide layer 160 may comprise a thermal oxidation method, a deposition method or a combination of these methods. An example of a thermal oxidation method comprises an in-situ steam generation ("ISSG") method or a PECVD ("plasma enhanced chemical vapor deposition") method using TEOS (tetraethylorthosilicate) as a starting material. The field oxide layer 160 may have a thickness of approximately 100 to 500 nm, depending on the voltage class of the power transistor that is to be formed. Thereafter, an annealing step may be performed. The field oxide layer 160 covers the surface of the logic circuit portion and covers components of the lateral trench transistor portion 10. Further, the field oxide layer 160 lines the field plate trenches 252. The field oxide layer fills the gate trenches 212, the source contact groove 207 and the drain contact groove 208.

FIG. 2C shows an example of a resulting structure. Thereafter, doping steps may be performed so as to define the body portion of the lateral trench transistor. To this end, a hard mask layer stack 180, e.g. a carbon hard mask 171 may be formed over the semiconductor substrate, which may be followed by an amorphous silicon layer 174. The hard mask layer stack 180 is patterned using e.g. a photolithographical method. The hard mask layer stack 180 is patterned so as to leave the drain contact groove 208, the source contact groove 207 and a semiconductor portion between the source contact groove and the field plate trench 252 uncovered. Further, the logic circuit portion 15 is covered by the hard mask layer stack 180. Thereafter, a photoresist layer 173 is formed over the resulting structure. The photoresist layer 173 is patterned so as to leave the source contact groove 207 and adjacent semiconductor material uncovered. The drain contact groove 208 is covered by the photoresist layer 173. Then, ion implantation methods for defining the body region may be performed. For example, different methods may be employed, at different energies and, optionally, at different angles or different implantation doses. The different parameters may be set so as to set a desired doping profile. For example, the different energies may be set to achieve a constant doping level at different depths of the substrate. As a result, the second doped portion 222 is formed. The second doped portion 222 is directly adjacent to the source contact groove 207 and overlaps with the gate trenches 212.

FIG. 2D shows an example of a resulting structure. The cross-sectional view of FIG. 2D is taken so as to show a cross-sectional of the lateral trench transistor portion 10 between I and I' as is also shown in FIG. 1A. As is shown, due to the doping step with dopants of the second conductivity type, e.g. n-type dopants, the doped portion 222 is formed.

As an alternative to the above-described sequence, classical lithographical methods may be performed for forming the body implantation region and for etching the oxide.

Thereafter, the carbon hard mask 171 may be trimmed, e.g. isotropically etched so that the gate trench 212 is uncovered. Then, an etching process of etching silicon oxide is performed. As a result, the field oxide layer 160 is removed from the gate trenches, from the source contact groove 207 and from the drain contact groove 208. An oxide layer forming a gate dielectric layer 211 as well as a silicon oxide layer 111 which lines the source contact groove 207 and the drain contact groove 208 may be formed. For example, forming the oxide layer may comprise a thermal oxidation method or a deposition method or a combination of these methods similar as has been explained above. For example, the oxide layer 111 may be formed by thermal oxidation.

Figure 2E:
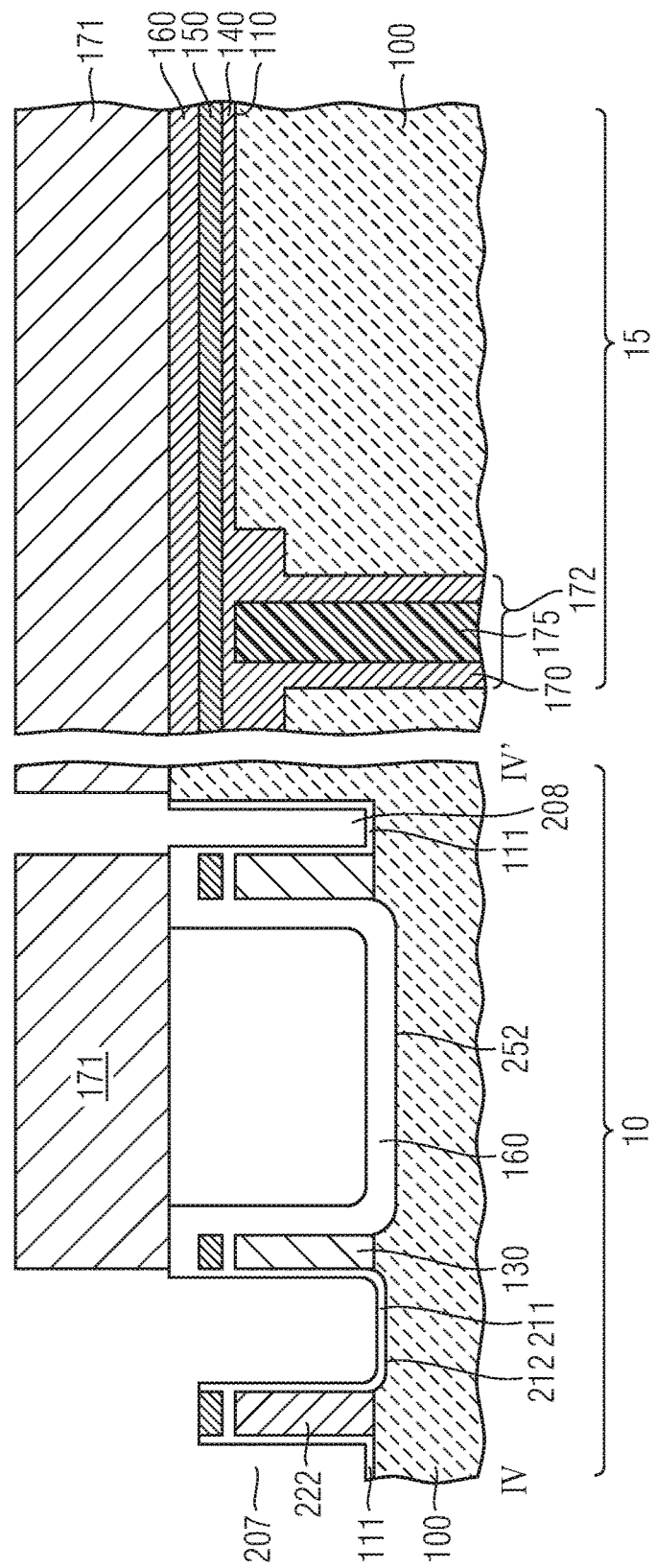

FIG. 2E shows an example of a resulting structure. Then, the residues of the hard mask are removed.

Figure 2F:
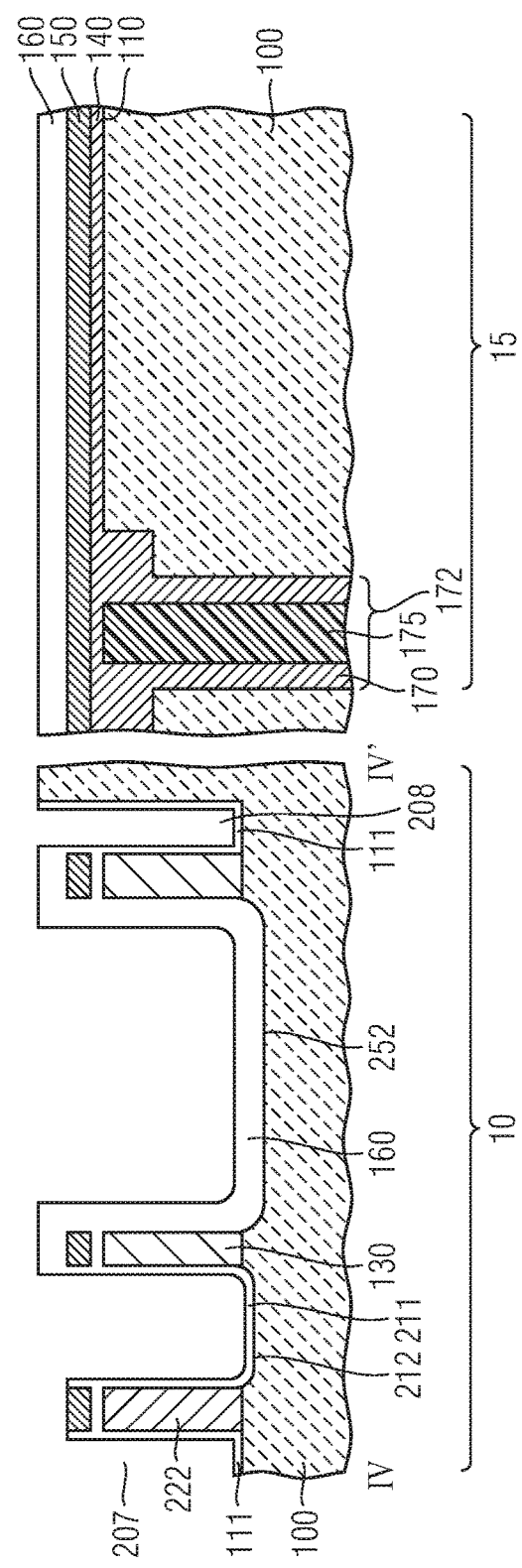

FIG. 2F shows an example of a resulting structure. As is illustrated in FIG. 2F, the field plate trench 252 is lined with the field oxide layer 160. Further, the gate trench 212, the source contact groove 207 and the drain contact groove 208 are lined with a thin dielectric layer 211, 111.

Thereafter, a conductive material 185 for forming the field plate 250 and the gate electrode 210 is filled in the field plate trench 252 and the gate trench 212. For example, heavily n-doped polysilicon may be formed by generally known methods. As is shown, a thick polysilicon layer is formed over the logic circuit portion 15. Further, a thick polysilicon layer 185 is formed over the lateral trench transistor portion 10. The polysilicon layer 185 is planarized.

FIG. 2G shows an example of a resulting structure. Thereafter, a polishing step, e.g. a CMP ("chemical-mechanical polishing") step may be performed so as to planarize the polysilicon layer and the silicon oxide layer 160. For example, the CMP step may be performed, using the silicon nitride layer 150 as a stopping layer. As a result, an upper side of the gate electrode and the field plate 250 are flush with an upper side of the silicon nitride layer 150. Thereafter, a photoresist layer 187 may be formed over the work piece. The photoresist layer 187 may be patterned so as to uncover the polysilicon 185 in the drain contact groove 208 and the source contact groove 207. Then, the polysilicon 185 is removed from the drain contact groove 208 and from the source contact groove 207. A doping process may be performed so as to form the source region 201 and the drain region 205. For example, this may be accomplished using a tilted ion implantation step which introduces dopants through a sidewall of the source contact groove 207 or the drain contact groove 208. Further, a body contact portion 225 may be defined by a corresponding doping process. For example, the doping process may be a vertical doping process, which dopes a bottom portion of the source contact groove 207.

For example, before performing the doping process for defining the body contact portion 225, the drain contact groove 208 may be covered by the suitable materials so that dopants will be introduced only in the source contact groove 207. Alternatively, the body contact portion may also be formed by doping a sidewall of the source contact groove 207, for example, when the body contact portion comprises a vertical portion that extends along the source contact groove in a vertical direction. In this case, first sidewall portions may be covered by the polysilicon filling 185, while a doping process for forming the source regions 201 is performed. Thereafter, further polysilicon may be filled in the source contact groove 207 and the material in the source contact groove 207 may be patterned so as to expose those portions in which the body contact portion 225 is to be formed. The body contact portion may be formed by doping with dopants of the second conductivity type, whereas the source region is formed by doping with dopants of the first conductivity type.

As is readily to be appreciated, the doping processes for doping with the first conductivity type and the second conductivity type may be reversed.

Figure 2H:
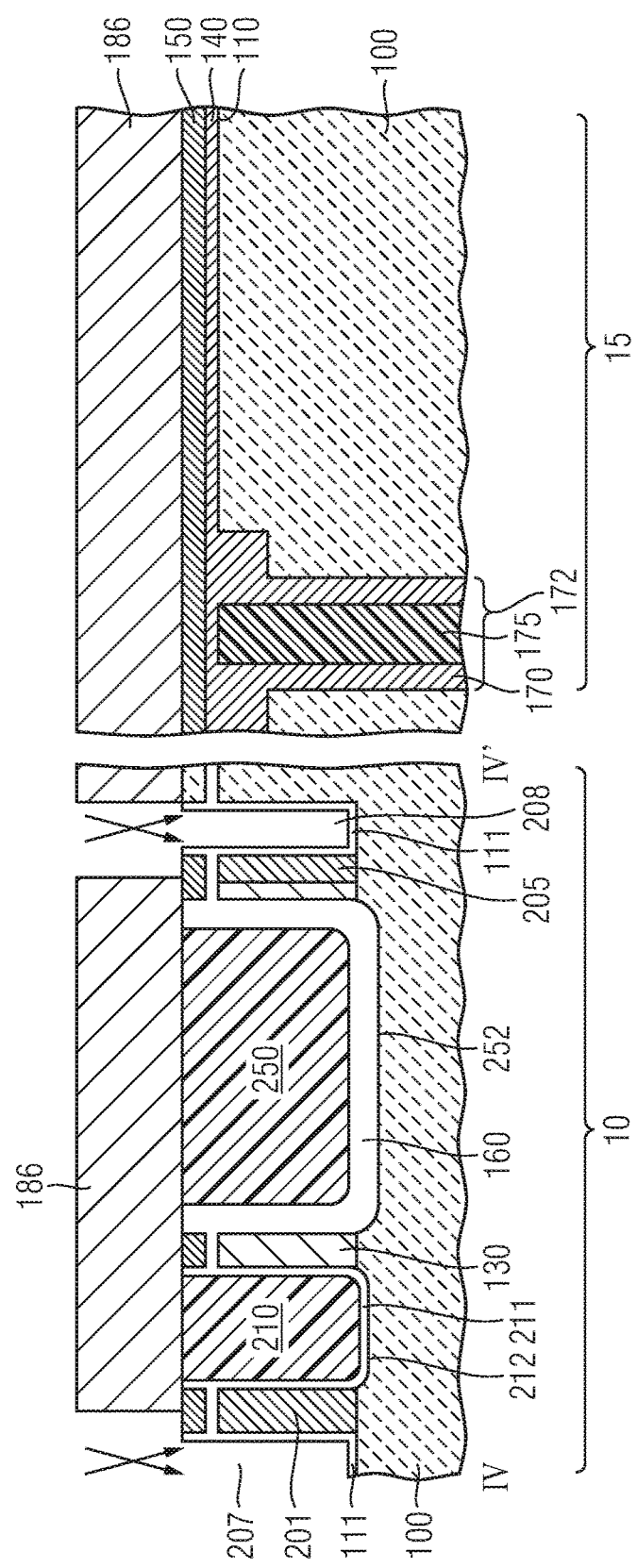

FIG. 2H schematically illustrates the process of performing a tilted ion implantation process. Thereafter, a sacrificial material 190 such as doped polysilicon is filled in the source contact groove 207 and in the drain contact groove 208. Further, a CMP step may be performed so as to obtain a planar surface. Then, a silicon nitride liner 151 may be formed over the resulting structure.

FIG. 2I shows an example of a cross-sectional view of a work piece after performing this processing step. As is shown, the components formed in the lateral trench transistor portion 10 are protected by the silicon nitride liner 151.

As is to be appreciated due to the CMP process which is performed after filling the conductive material in the gate trenches, the gate electrodes 210 of different gate trenches 212 and assigned to different transistor cells 200 are not physically connected to each other. In other words, in a similar manner as has been shown in FIG. 1B, the gate electrodes of adjacent transistor cells may be separate from each other and may not be connected by a horizontal portion of the conductive material. Instead, they will be connected to respective gate contacts which are connected to a gate terminal.

According to a modification of the process flow described above, the doping processes for forming the source region, the drain region and the body contact portion may be performed after removing the residues of the hard mask as described above with reference to FIG. 2F. In this case, removing the polysilicon layer 185 from the source contact groove 207 and from the drain contact groove may be dispensed with. In this case, the polysilicon layer 185 corresponds to the sacrificial layer filled in the source contact groove and the drain contact groove.

FIGS. 3A to 3F explain processes for forming components of the logic circuit in the logic circuit portion 15.

Figure 3A:
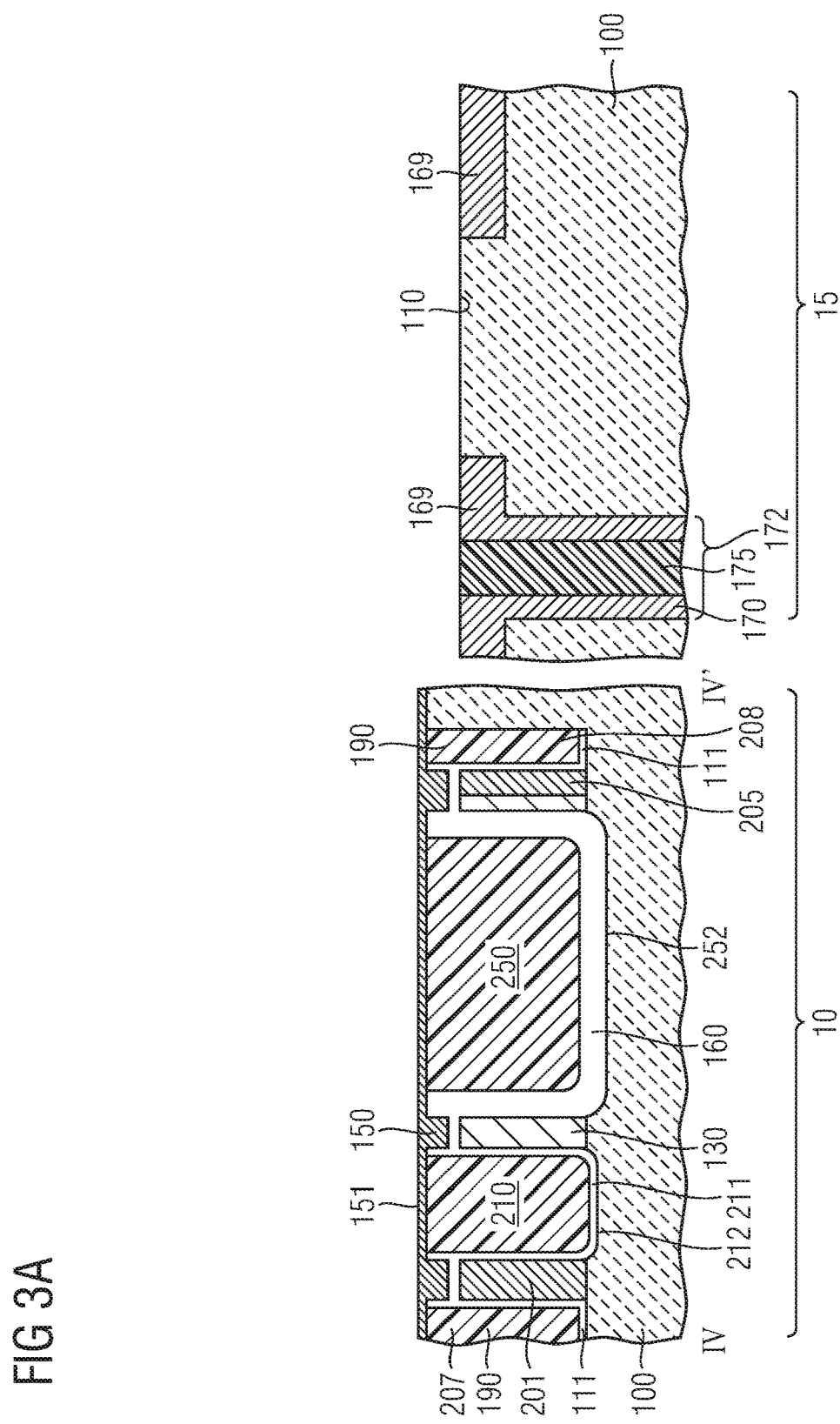

In a first process, the silicon nitride liner 150 which acts as a block mask is removed from the logic circuit portion. Further, optionally portions of the oxide layer may be removed. Further, shallow trench isolation (STI) portions 169 are formed in the first main surface 110. FIG. 3A shows an example of a resulting structure.

Figure 3B:
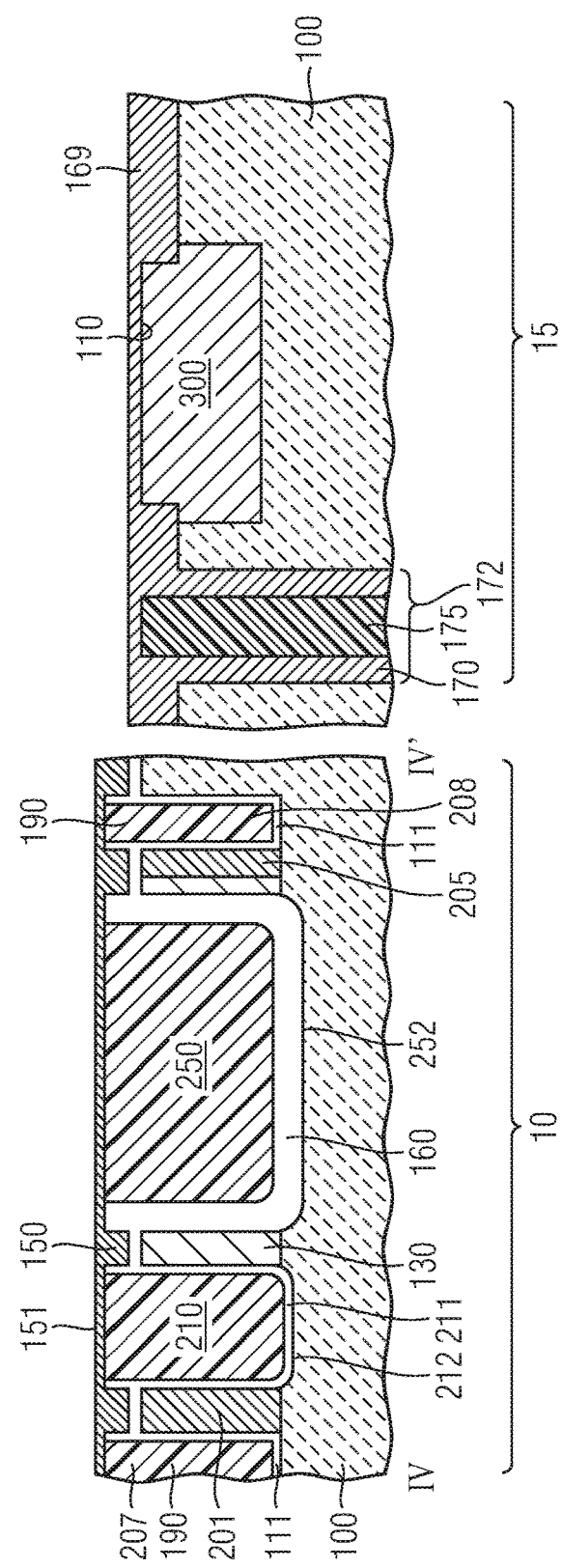

Thereafter, a doping process is performed so as to form a doped well portion 300. Further, implantation steps are performed so as to set a threshold voltage of the transistor to be formed. Moreover, a gate dielectric layer 311 may be formed over the substrate surface portion. For example, the gate dielectric layer 311 may be formed by a so-called dual gate oxide process which forms oxide layers having different thicknesses. FIG. 3B shows an example of a resulting structure.

Figure 3C:
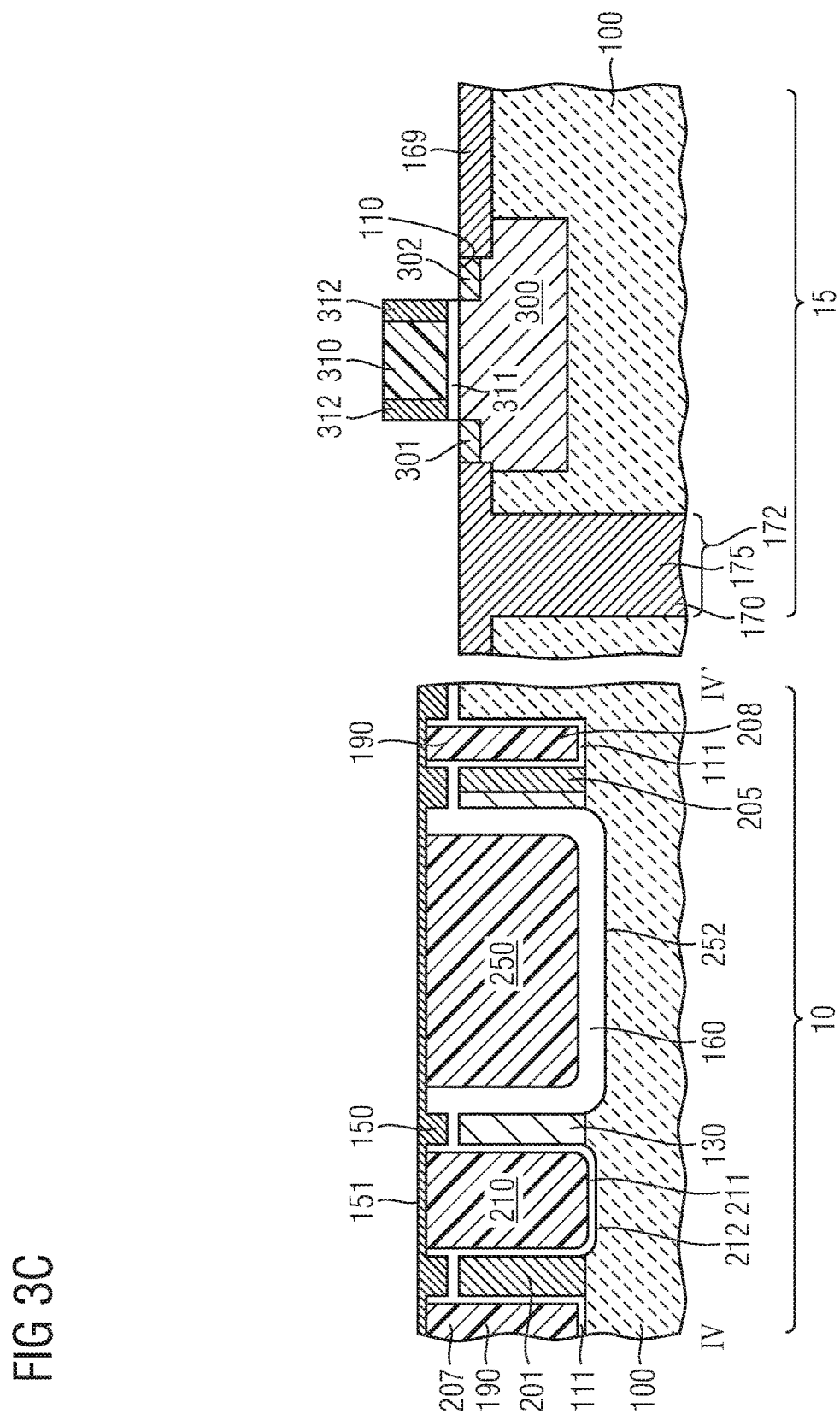

Thereafter, a conductive layer for forming the gate electrode such as doped polysilicon is formed over the resulting structure and patterned, e.g. using photolithographical methods, to form a gate electrode 310 of the logic circuit. Spacers 312 of silicon nitride may be formed adjacent to sidewalls of the gate electrode 310. Taking the gate electrode and the spacers as an etching mask, the gate dielectric layer 311 may be patterned. Further, source and drain implantation steps may be performed so as to form a source region 301 and a drain region 302 of the logic circuit. FIG. 3C shows an example of a resulting structure.

Thereafter, a silicon nitride layer 410 which may act as a mask may be formed over a surface of the work piece. The silicon nitride layer 410 may be patterned so as to cover the isolation trench 172. Then, metal silicide contacts 303, 304, 305 may be formed over the source region 301, the drain region 302 and the gate electrode 310 of the logic circuit, e.g. using a self-aligned silicide process. For example, a metal layer such as titanium, nickel or cobalt may be formed e.g. by sputtering over a surface of the work piece. Thereafter, the workpiece is annealed e.g. at a temperature of 450 to 750° C. Due to this annealing, a metal silicide layer is formed at the interface between the metal layer and the silicon material. Further, no metal silicide layer is formed at those portions in which the metal layer is formed over a silicon nitride layer or an insulating layer.

Figure 3D:
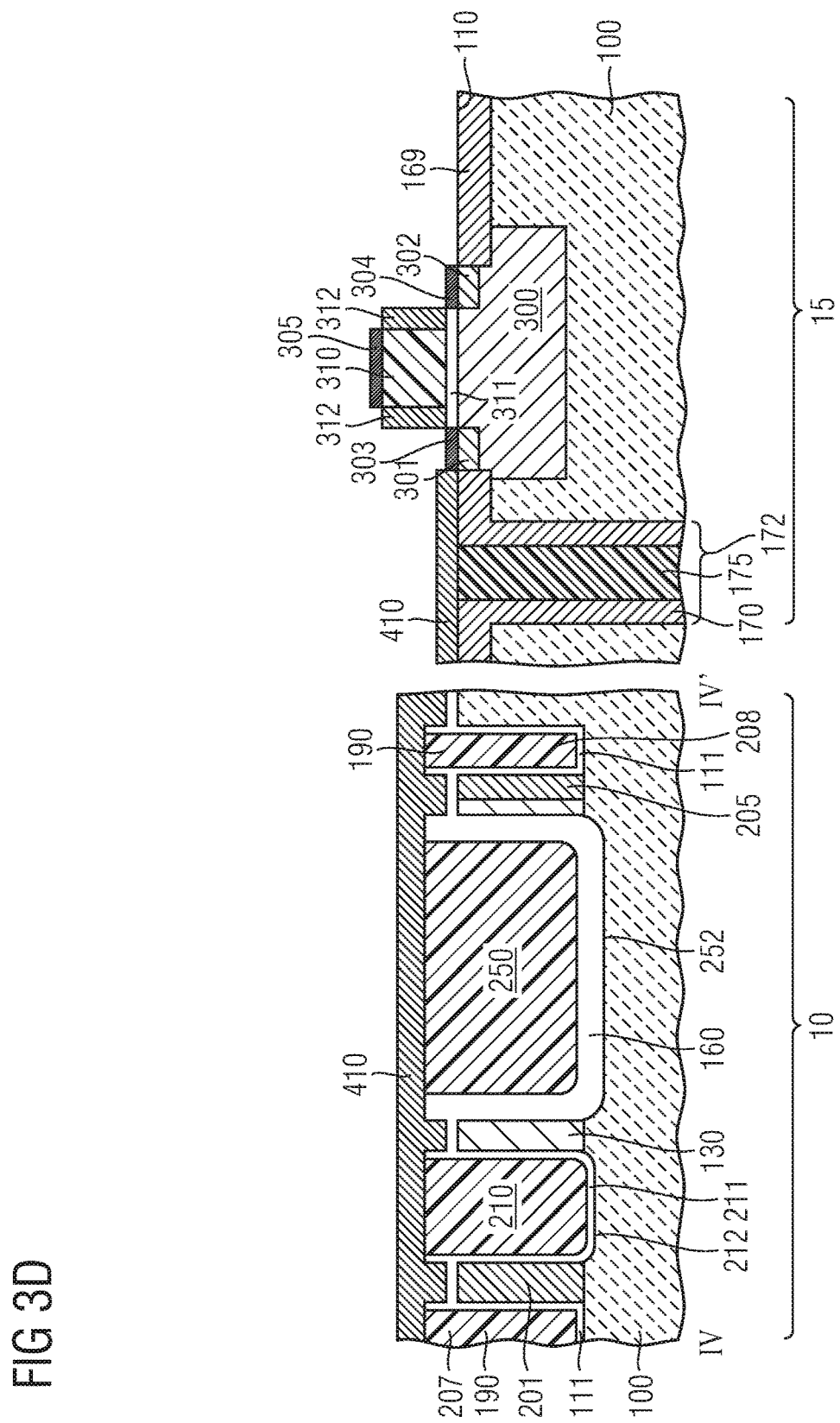

As a result of the silicide process, a source contact 303 is formed adjacent to the source region 301, a drain contact 304 is formed adjacent to the logic drain region 302, and a gate contact 305 is formed adjacent to the logic gate electrode 310. FIG. 3D shows an example of a resulting structure.

Thereafter, further liner layers and insulating layers are formed over the resulting work piece. For example, a silicon nitride layer 411 may be formed over the work piece, followed by an insulating layer 412, e.g. a PSG ("phosphorus silicate glass") or BPSG ("boron phosphorus silicate glass") layer 412. FIG. 3E shows an example of a resulting work piece.

Figure 3F:
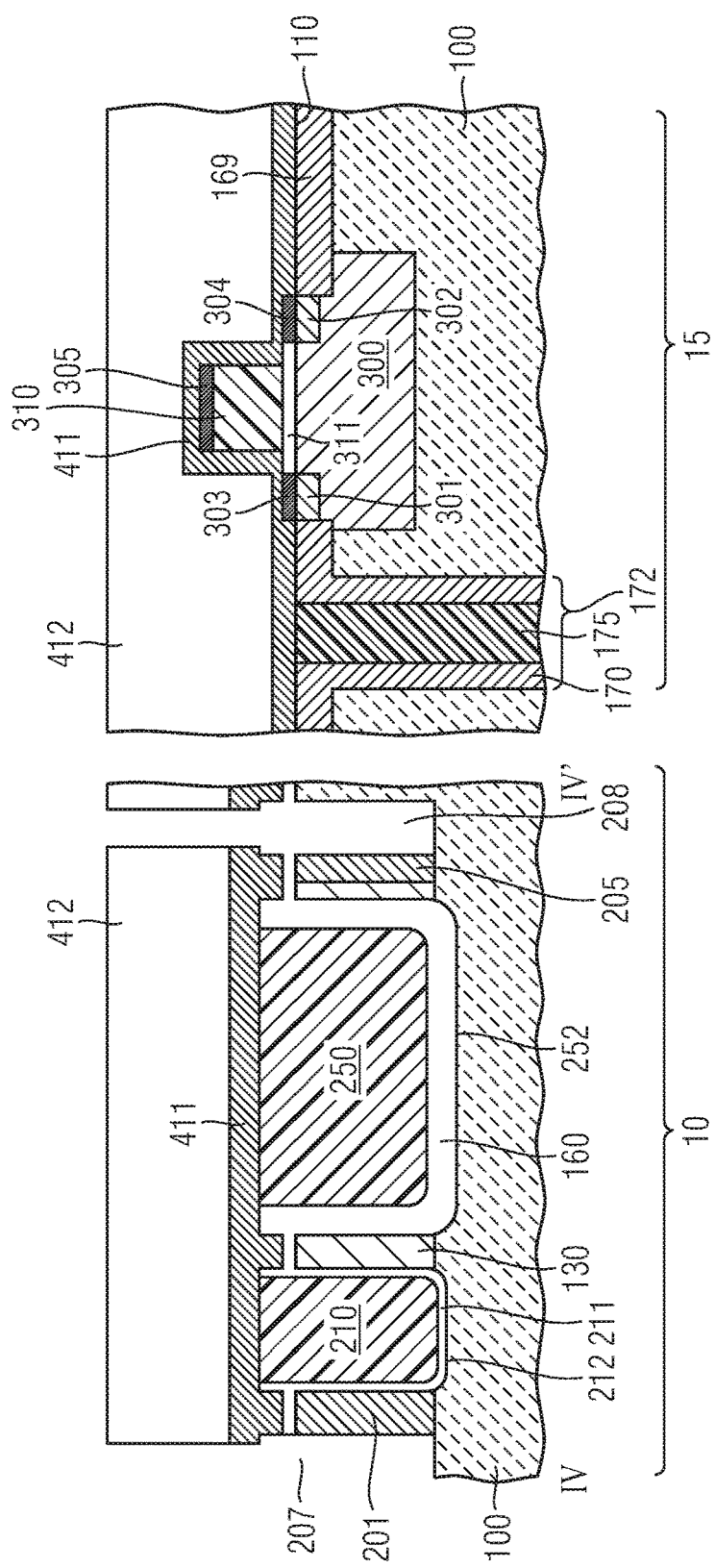

Thereafter, a lithographical method may be employed so as to open the insulating layer 412 over the sacrificial material 190 in the source contact groove 207 and the drain contact groove 208. An etching process is performed so as to remove the sacrificial material 190 from these grooves. Further, the oxide layer 111 lining the sidewalls and the bottom side of the source contact groove 207 and the drain contact groove 208 is removed. FIG. 3F shows an example of a resulting structure.

Thereafter, a photolithographical process is performed so as to form openings in the insulating layer 412 to form gate contacts 421 in contact with the gate electrodes 210 and in order to form field plate contacts 422 which are in contact with the field plates 250. After defining the contact holes, a metal (source conductive material) may be formed in the source contact groove 207, the drain contact groove 208 and the contact holes for contacting the gate electrodes 210 and the contact holes for contacting the field plates 250. For example, this may be accomplished by forming a combination of Ti/TiN by a CVD or sputtering method, followed by forming a tungsten layer by a CVD method. For example, thereby, the source contact 420, the drain contact 423, the gate contact 421 and the field plate contact 422 may be formed in the lateral trench transistor portion 10.

When forming the contacts in the lateral trench transistor portion 10, also contacts to components in the logic circuit portion 15 may be formed, e.g. by joint or common processes. For example, a source contact plug 424 to the source contact 303 may be formed. Further, a drain contact plug 425 in contact with the drain contact 304 of the logic circuit portion 15 may be defined. According to a further embodiment, the contacts in the logic circuit portion 15 may also be formed before or after forming the contacts in the lateral trench transistor portion 10.

Figure 3G:
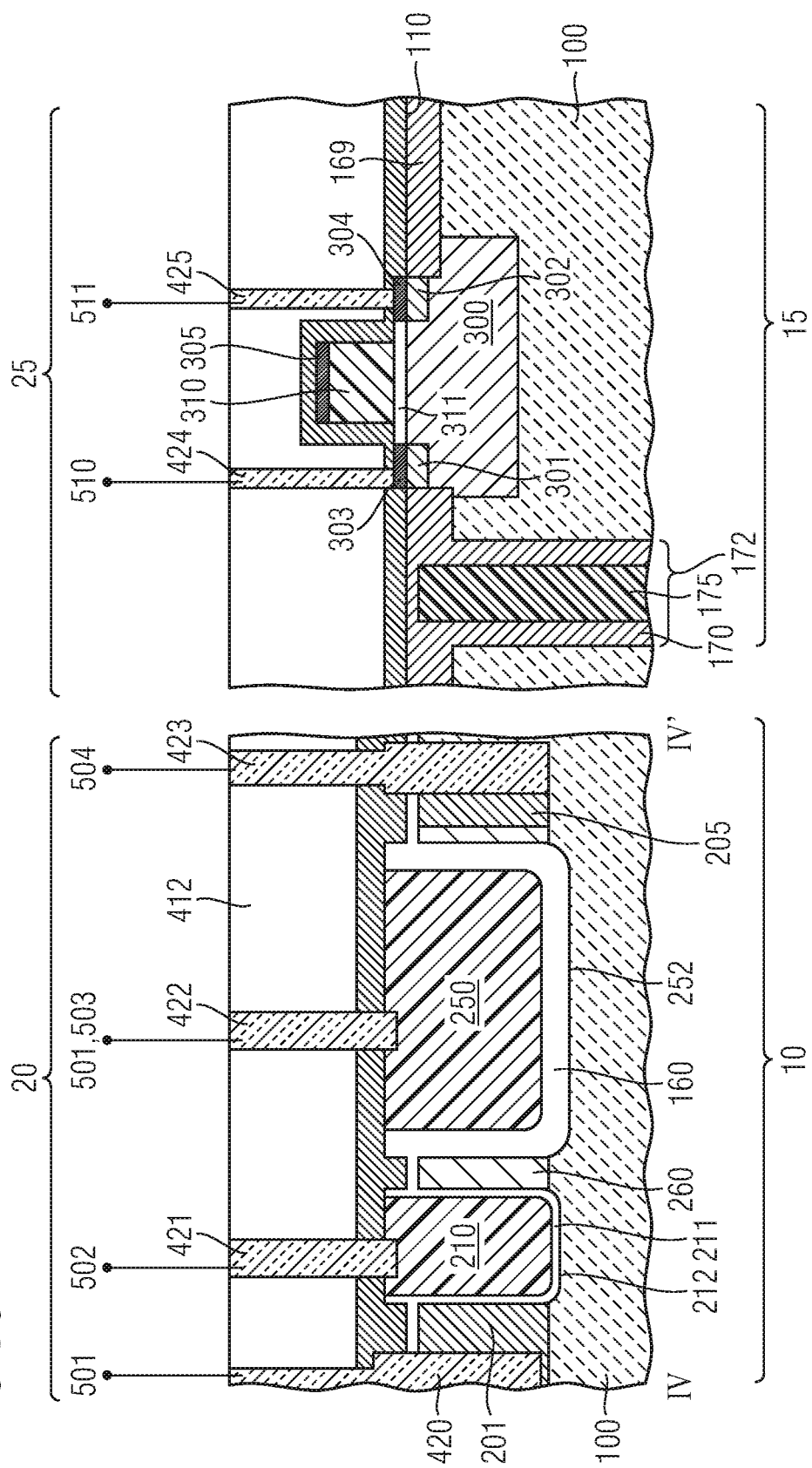

As is to be readily understood, the method of forming the contacts and contact holes may be modified in various manners. For example, the contact holes for contacting the gate electrodes 210 and the field plates 250 may be formed by etching steps which also remove the sacrificial material 190 from the source contact groove and the drain contact groove. FIG. 3G shows an example of a resulting structure. As is shown, a semiconductor device 20, e.g. a lateral trench transistor comprising a plurality of transistor cells is formed in the lateral trench transistor portion 10. Further, a logic circuit element 25 is formed in the logic circuit portion 15.

For example, the source contact 420 is connected to a plurality of parallel transistor cells and further is connected to the source terminal 501. Further, a plurality of gate electrodes 210 is connected via separated gate contacts 421 to the gate terminal 502. In a similar manner, a plurality of field plate contacts 422 is connected to a plurality of field plates 252 and to e.g. the source terminal 501 or another terminal 503. Moreover, the drain contact 423 is electrically connected to a plurality of adjacent transistor cells 200.

As has been explained above, first, components of the lateral trench transistor, e.g. the power transistor are formed, followed by filling a sacrificial material in the source contact groove 207 and the drain contact groove 208. The sacrificial material may be replaced by a temperature sensitive conductive filling at a later processing stage. As a consequence, processes which may require higher temperatures, e.g. temperatures necessary for forming components of the logic circuit portion may be performed. Since the processes for forming the metal contacts is performed after processing the components of the logic circuit, high temperatures for forming the components of the logic circuit will not affect the integrated circuit. Further, doping processes for forming the source and drain region of the logic circuit element are performed after the processes for forming the source region of the lateral trench transistor. As a consequence, drawbacks, e.g. short-circuits in the logic circuit portion, may be avoided. These drawbacks might occur when the temperature treatment for outdiffusing the dopants for forming the source region is performed after forming the source and drain region of the logic circuit element. Further, due to the special processing sequence including filling a conductive material in the field plate trench 252 and the gate trench 212 followed by a CMP step, a high planarity of the substrate portion in which the components of the lateral trench transistor are formed may be achieved. As a result, the surface of the work piece has a low degree of topography and is very planar. This further facilities the method for forming an integrated circuit.

FIGS. 4A to 4E show modifications of the process by which the topography of the substrate may be further reduced.

Figure 4A:
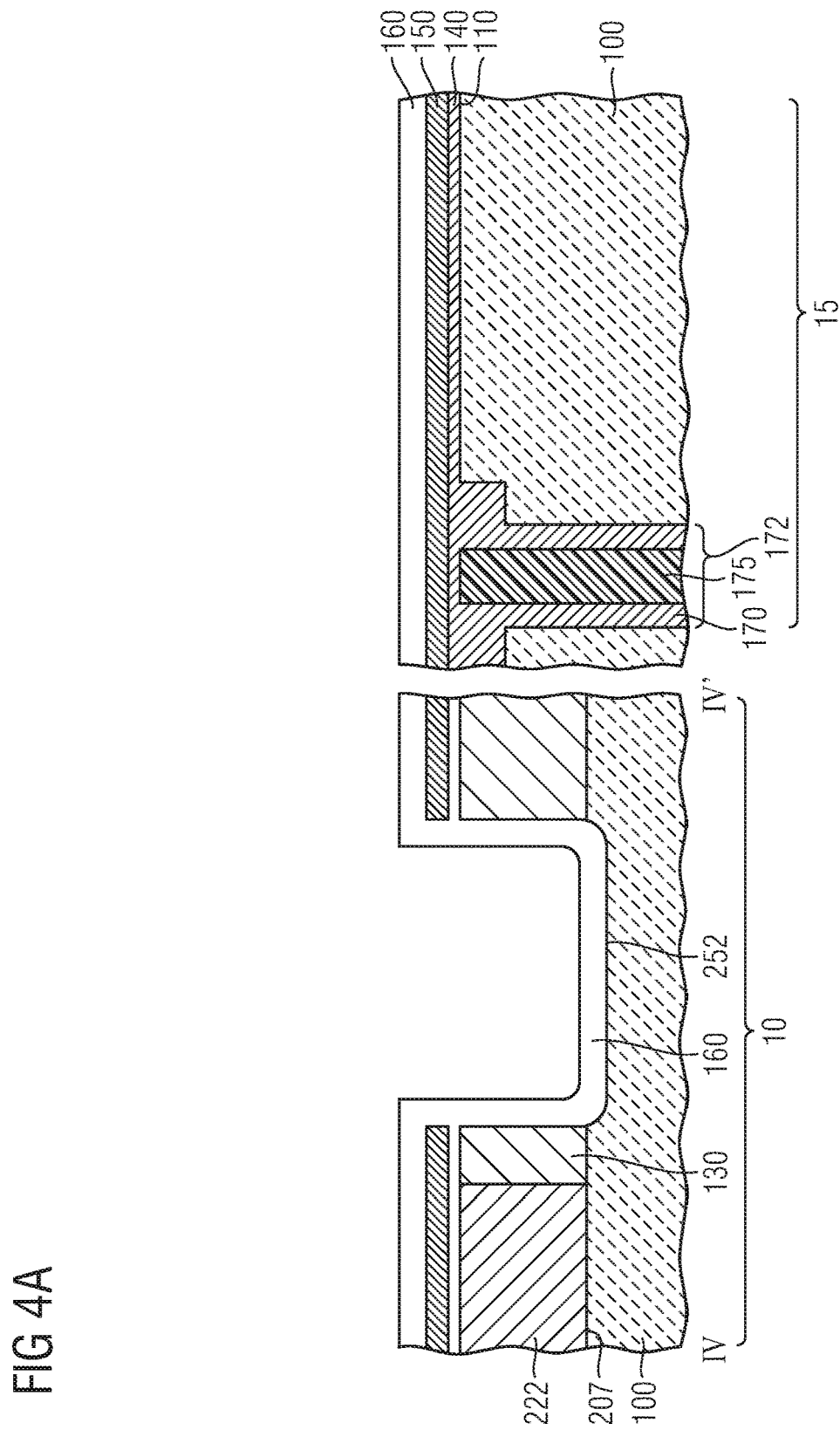

Starting from the work piece which is e.g. shown in FIG. 2A, a further doping process is performed so as to form the second doped portion 222 in the lateral trench transistor portion 10. Thereafter, an oxidation step may be performed so as to form the silicon oxide layer 140. Further, a silicon nitride liner 150 may be formed over the entire surface of the work piece. Then a hard mask (not shown) may be formed. For example, the hard mask may comprise a BSG layer, which may have a thickness of 400 to 600 nm, e.g. 500 nm, followed by a carbon layer, which may have a thickness of 250 to 350 nm, e.g. 300 nm. Thereafter, a SiON layer, which may have a thickness of approximately 50 nm may be formed over the resulting work piece. Then, field plate trenches 252 may be photolithographically defined in the first main surface 110 of the semiconductor substrate. The trenches may be defined in the hard mask layer stack, followed by an etching step for etching the trenches. Thereafter, the residues of the hard mask are removed and an isotropic etching step may be performed so as to round the edge corners. A thermal oxidation step may be performed, followed by a process of forming a field oxide layer 160. For example, the field oxide layer 160 may be formed by a low pressure CVD method with TEOS as a starting material. The field oxide layer may have a thickness of approximately 200 to 300 nm, e.g. 220 nm. FIG. 4A shows an example of a resulting structure.

Figure 4B:
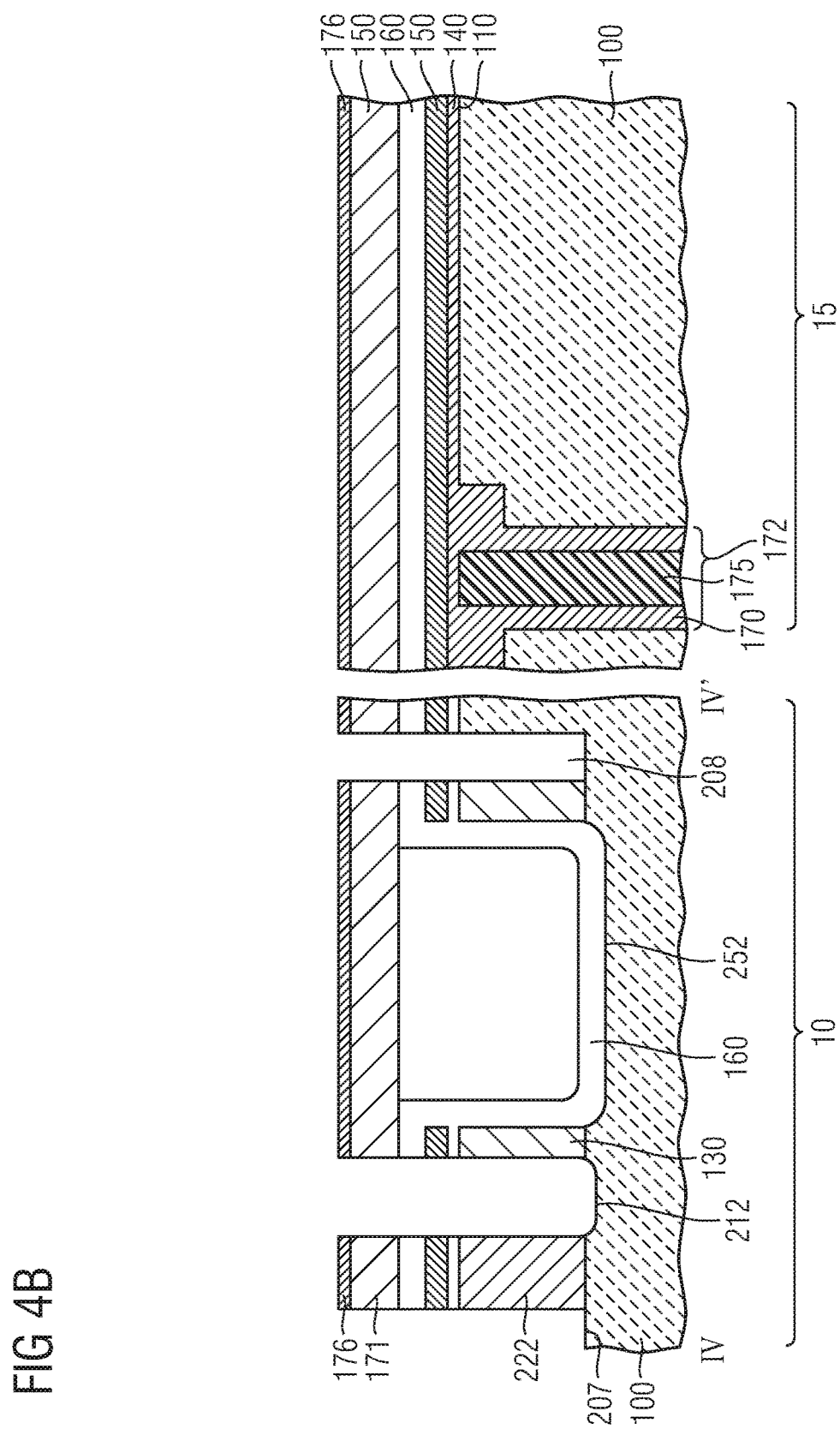

Thereafter, a hard mask layer stack may be formed over the resulting structure. For example, the hard mask layer may comprise a carbon layer 171, followed by a further layer 176, e.g. a SiON layer or an amorphous silicon layer. Then, the gate trench 212, the source contact groove 207 and the drain contact groove 208 are photolithographically defined. An etching step is performed to etch the source contact groove 207, the drain contact groove 208 and the gate trench 212. FIG. 4B shows an example of a resulting structure.

Figure 4C:
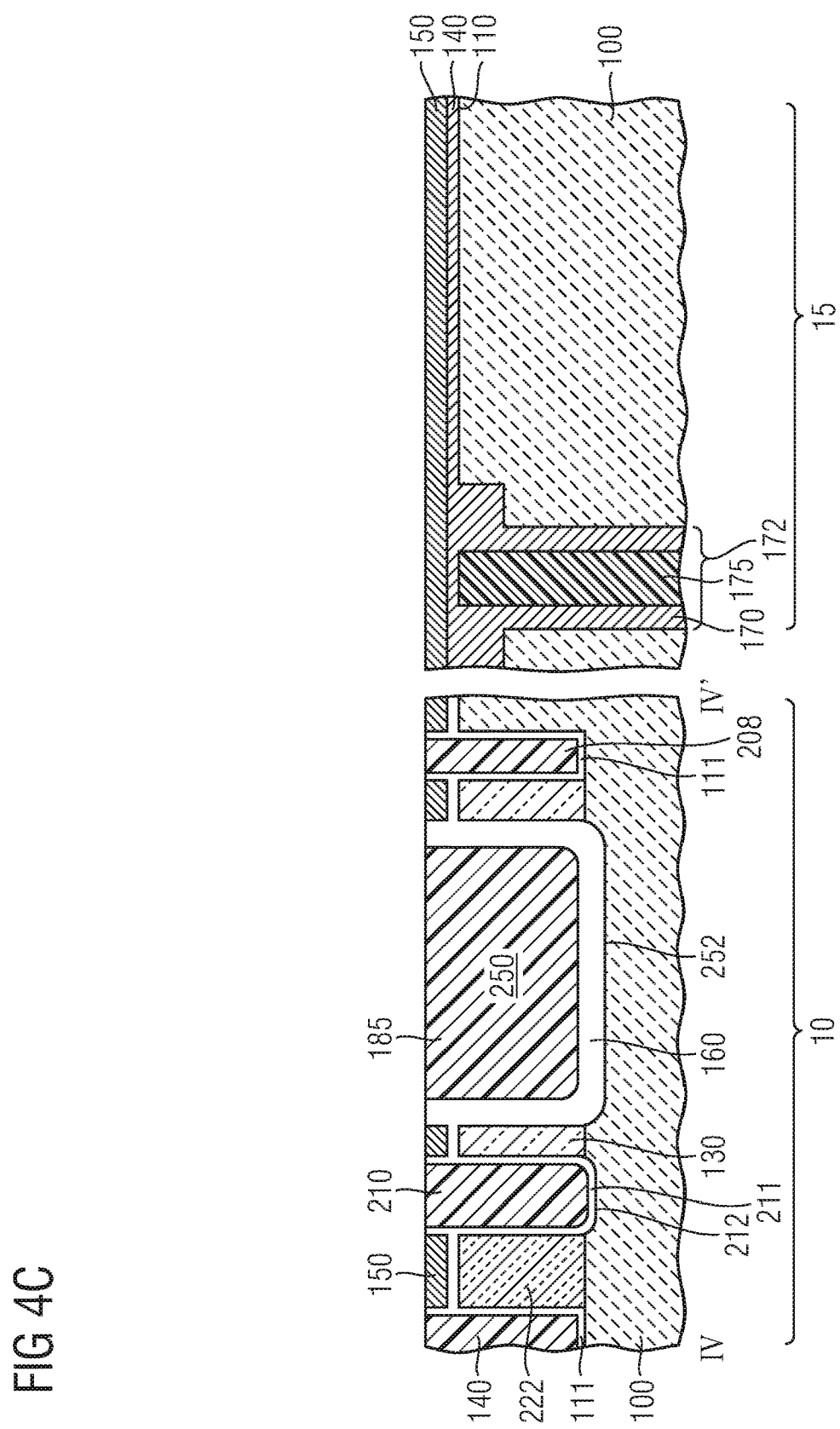

As is shown, due to the fact that the field plate trenches 252 are formed after forming the second doped portion 222, the field oxide layer 160 is formed over the second doped portion 222. As a consequence, a higher degree of planarity of the workpiece may be achieved. Thereafter, the residues of the hard mask layer stack are removed. Further portions of the field oxide layer 160 over the horizontal silicon nitride liner are removed, followed by an oxidation step for forming a gate dielectric layer 211 on sidewalls and the bottom side of the gate trench 212 and for forming a dielectric layer 111 on a bottom side and a sidewall of the source contact groove 207 and the drain contact groove 208. A doped polysilicon layer 185 is formed to fill the gate trenches 212, optionally, the field plate trenches 252, the source contact groove 207 and the drain contact groove 208. A CMP step may be performed which stops on an upper side of the silicon nitride layer 150. FIG. 4C shows an example of a resulting work piece. Due to the absence of a step of the field oxide layer 160 over the horizontal portions of the workpiece, a higher degree of planarity of the workpiece may be achieved.

Figure 4D:
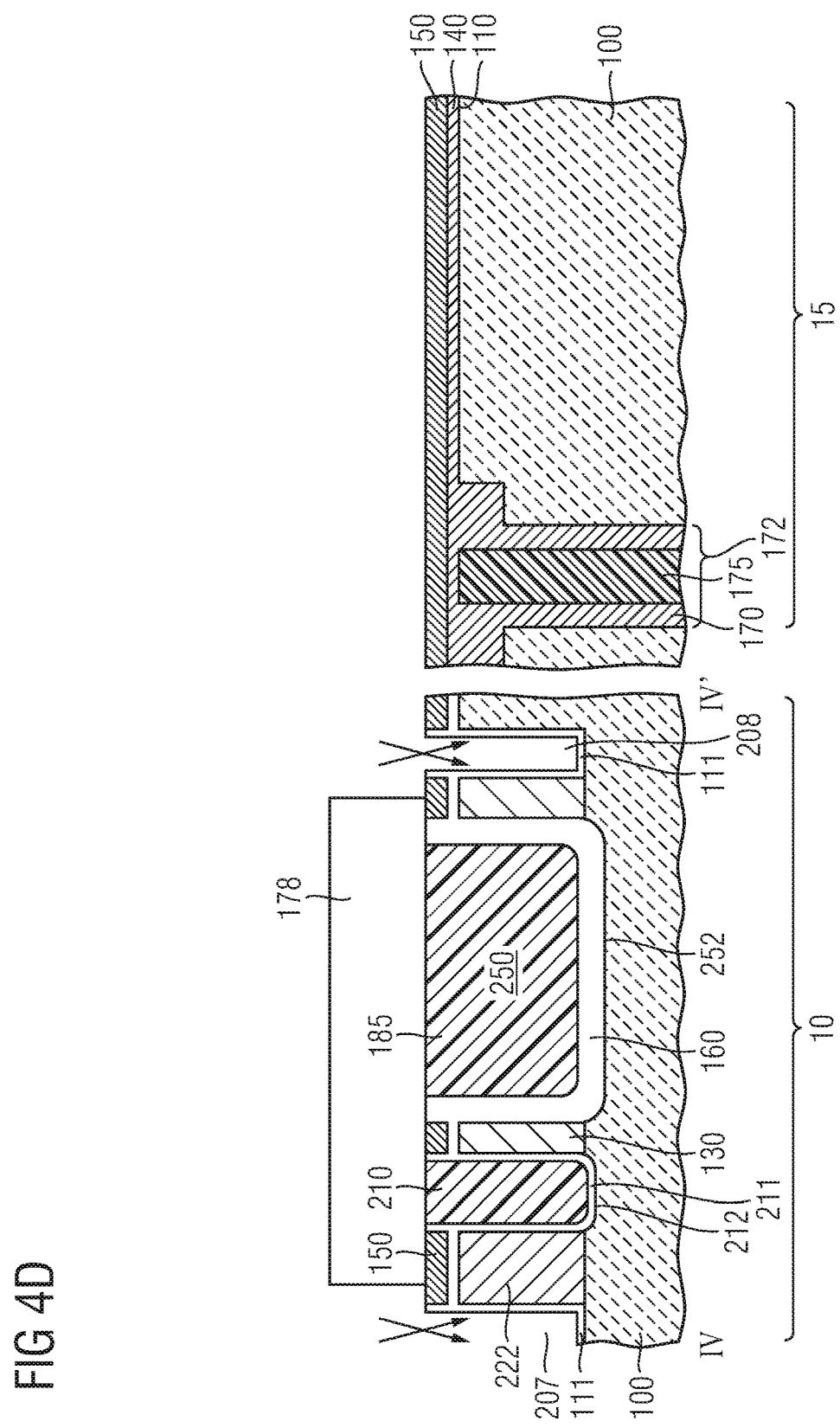

Thereafter, in a similar manner as has been explained above, a photoresist layer 178 is formed over the work piece and patterned so as to expose a top side of the source contact groove 207 and the drain contact groove 208. Doping processes for forming the source region 201, the drain region 205 and the body contact portion 225 are performed in a similar manner as has been explained above with reference to FIG. 2H. FIG. 4D shows an example of a structure when performing this tilted ion implantation process.

Thereafter, a sacrificial layer 190 is formed to fill the source contact groove 207 and the drain contact groove 208. Then, a CMP step is performed so as to obtain a planar surface. FIG. 4E shows an example of a resulting structure. Starting from the structure shown in FIG. 4E, the process illustrated with reference to FIGS. 3A to 3G is performed so as to obtain the structure shown in FIG. 3G.

A method for forming an integrated circuit comprising a high-voltage power Lateral trench transistor has been described in the foregoing. In more detail, the power lateral trench transistor described above comprises a drift zone and, optionally, a field plate. According to a further embodiment, the integrated circuit may comprise a low-voltage lateral trench transistor without a drift zone and without a field plate. In such a low-voltage lateral trench transistor the drain region 205 is directly adjacent to the body region 220. The process, which is e.g. based on the modification described with reference to FIGS. 4A to 4E, may be further modified for forming a low-voltage lateral trench transistor. For example, starting from the workpiece shown in FIG. 2A, a further doping process is performed so as to form the second doped region 222 in the lateral trench transistor portion 10. Thereafter, an oxidation step may be performed so as to form the silicon oxide layer 140. Further, a silicon nitride liner 150 may be formed over the entire surface of the work piece. Then a hard mask (not shown) may be formed. For example, the hard mask may comprise a BSG layer, which may have a thickness of 400 to 600 nm, e.g. 500 nm, followed by a carbon layer, which may have a thickness of 250 to 350 nm, e.g. 300 nm. Thereafter, a SiON layer, which may have a thickness of approximately 50 nm may be formed over the resulting workpiece. Then, gate trenches 212, a source contact groove 207 and a drain contact groove 208 may be photolithographically defined in the first main surface 110 of the semiconductor substrate. The trenches may be defined in the hard mask layer stack, followed by an etching step for etching the trenches. Thereafter, the residues of the hard mask are removed and an isotropic etching step may be performed so as to round the edge corners. As a result, a structure similar to the one shown in FIG. 4B may be obtained.

Then, the further steps described with reference to FIGS. 4C to 4E and further FIGS. 3A to 3G may be performed to form the components of the integrated circuit comprising the low-voltage lateral trench transistor.

Figure 5:
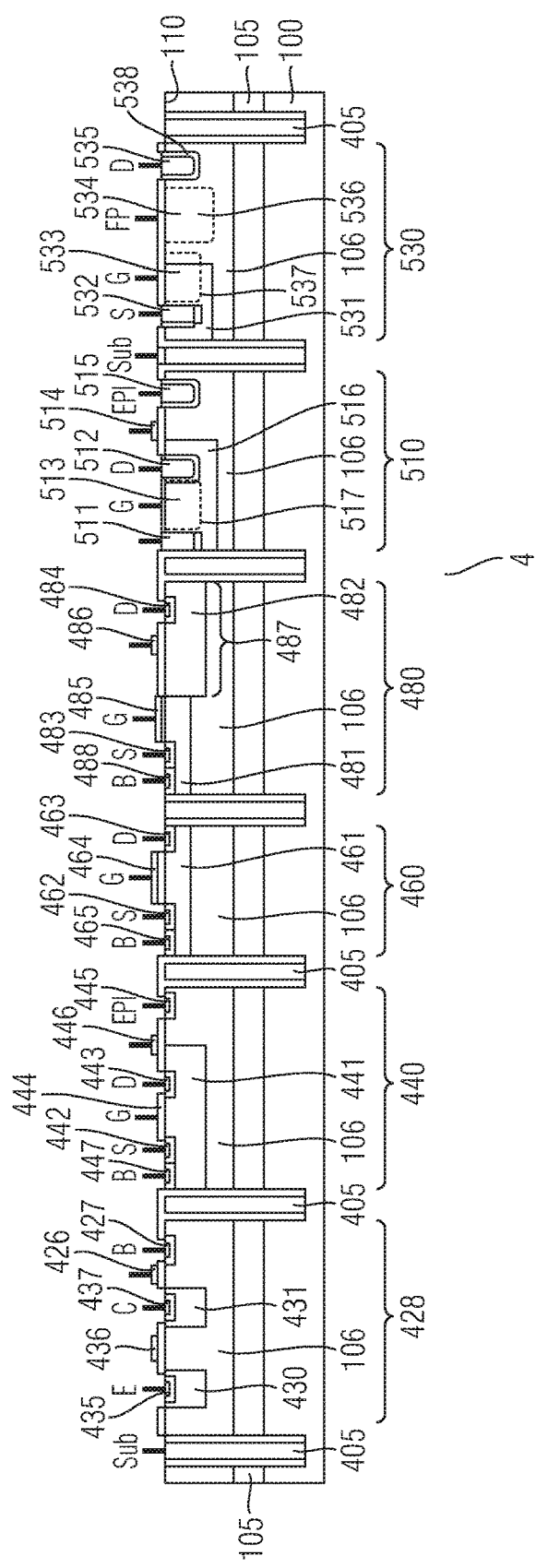
FIG. 5 shows a cross-sectional view of an example of an integrated circuit according to an embodiment.

FIG. 5 shows an example of a cross-sectional view of an integrated circuit 4 according to an embodiment. The integrated circuit 4 shown in FIG. 5 comprises a plurality of devices formed in a semiconductor substrate 100 having a first main surface 110. The single devices are insulated from each other by means of vertical isolation trenches 405 which may be trenches extending in a depth direction of the semiconductor substrate. An insulating layer may be formed on sidewalls of the isolation trenches. Further, a conductive material may be filled in the isolation trenches, which may be electrically connected to a substrate contact. A horizontal buried layer 105 may be formed in the semiconductor substrate 100. The isolation trenches 405 may extend to a deeper depth than the buried layer. A doped layer 106 of the first conductivity type may be formed over the buried layer 105. Components of the different circuits are defined in the doped layer 106 of the first conductivity type.

For example, the integrated circuit may comprise a power transistor 530 which has been formed in the manner as has been explained above with reference to FIGS. 2A to 4E. The power transistor 530 comprises a second doped portion 531, a source region 532 and a drain region 538. The source region 532 may be electrically connected to a source terminal and the drain contact 535 may be electrically connected to a drain terminal. The transistor 530 further comprises a gate electrode 533 and, optionally a field plate 534. A drift zone 536 is disposed between the body region 537 and the drain contact 535. The body region 537 is formed in the second doped portion 531.

The integrated circuit 4 may further comprise a low voltage lateral trench transistor 510. The low voltage lateral trench transistor 510 may have a similar construction as the high voltage transistor 530. The low voltage lateral trench transistor 510 may be manufactured by the method that has been explained above. In contrast to the high voltage transistor 530, the low voltage transistor 510 comprises a drain region 512 which is directly adjacent to the body region 517. The low voltage transistor 510 does not comprise a drift zone between the drain region 512 and the body region 517. For example, the drain region 512 may be arranged in the second doped portion 516 of the second conductivity type. The low voltage transistor 510 may further comprise a field plate 514 and a contact 515 which electrically connects the first doped layer 106 with a dedicated terminal.

The circuit further may comprise a high voltage transistor 480, e.g. a high voltage PMOS transistor comprising a n-well portion 481 and a p-well portion 482. The transistor comprises a source region 483, a gate electrode 485, a drift zone 487 and a drain region 484. The transistor 480 may further comprise a field plate 486. For example, the gate electrode 485 and the field plate 486 may be implemented as planar elements. In particular, a conductive material of the gate electrode 485 and of the field plate 486 may be disposed over a surface 110 of the semiconductor substrate. The high voltage transistor 480 may be formed by the method explained above.

The integrated circuit may further comprise CMOS transistors 440, 460, e.g. an n-channel transistor 440 and a p-channel transistor 460. The n-channel transistor 440 comprises a source region 442, a gate electrode 444 and a drain region 443. The body region is formed in the second doped portion 441. The transistor further comprises a field plate 446 and a contact portion 445 for contacting the first doped portion 106 to an EPI-contact. The transistor 440 further comprises a body contact 447.

The p-channel transistor 460 comprises a source region 462, and a drain region 463 and further a gate electrode 464. The p-channel transistor 460 further comprises a body contact 465. The n-channel transistor 440 and the p-channel transistor 460 may be formed by the process as explained above.

The integrated circuit 4 may further comprise a bipolar transistor 428. The bipolar transistor 428 may comprise an emitter doped region 430 and a collector doped region 431. The emitter doped region 430 is electrically connected via an emitter contact 435 to an emitter terminal. The collector doped portion 431 is electrically connected via a collector contact 437 to a collector terminal. A gate electrode 436 is disposed between the emitter doped portion 430 and the collector doped portion 431. The gate electrode 436 is entirely disposed over the first main surface 110 of the semiconductor substrate. The bipolar transistor 428 further comprises a basis contact 427 connected to a basis terminal. The bipolar transistor 428 may further comprise a field plate 426 which may be electrically connected to a source terminal, for example.

Figure 6A:
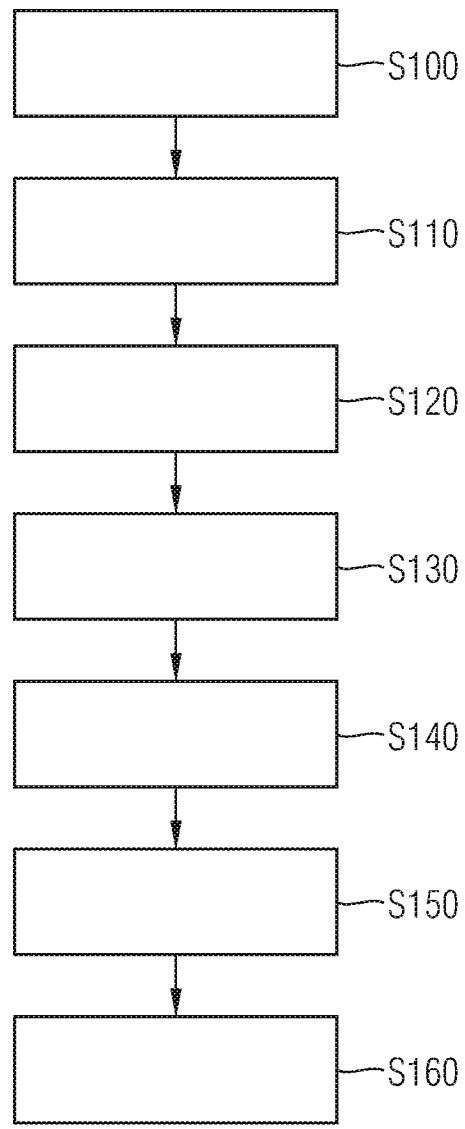
FIG. 6A summarizes a method according to an embodiment.

FIG. 6A summarizes a method according to an embodiment. A method of forming an integrated circuit including an array of transistors and a logic circuit element comprises forming a plurality of gate trenches (S100) in a first main surface of a semiconductor substrate, wherein a longitudinal axis of the gate trenches runs in a first direction parallel to the first main surface, forming a source contact groove (S110) running in a second direction parallel to the first main surface, the second direction being perpendicular to the first direction, the source contact groove extending along the plurality of gate trenches, forming a source region (S120) comprising performing a doping process by introducing dopants through a sidewall of the source contact groove, and filling a sacrificial material in the source contact groove (S130). The method further comprises, thereafter, forming components of the logic circuit element (S140), thereafter, removing the sacrificial material from the source contact groove (S150), and filling a source conductive material in the source contact groove (S160).

Figure 6B:
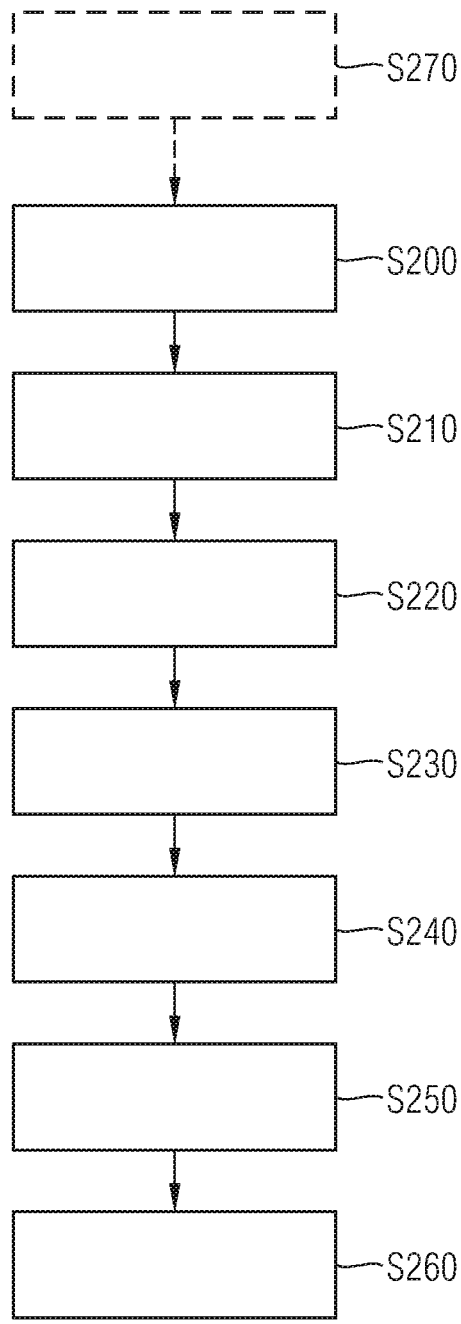
FIG. 6B summarizes a method according to a further embodiment.

FIG. 6B illustrates a method of forming an integrated circuit including an array of transistors and a logic circuit element according to a further embodiment. The method comprises forming a plurality of gate trenches in a first main surface of a semiconductor substrate (S200), wherein a longitudinal axis of the gate trenches runs in a first direction parallel to the first main surface, forming a drain contact groove (S210) running in a second direction parallel to the first main surface, the second direction being perpendicular to the first direction, the drain contact groove extending along the plurality of gate trenches, forming a drain region (S220) comprising performing a doping process by introducing dopants of a first conductivity type through a sidewall of the source contact groove, and filling a sacrificial material in the drain contact groove (S230). The method further comprises, thereafter, forming components of the logic circuit element (S240), thereafter, removing the sacrificial material from the drain contact groove (S250), and filling a source conductive material in the drain contact groove (S260).

The method may further comprise forming a second doped portion of a second conductivity type in a portion of the semiconductor substrate (S270), which may be performed before forming the plurality of gate trenches. According to this embodiment, the gate trenches and the drain contact groove may be formed in the second doped portion of the second conductivity type.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. A method of forming an integrated circuit including a lateral trench transistor and a logic circuit element, the method comprising:
   forming a plurality of gate trenches in a first main surface of a semiconductor substrate, wherein a longitudinal axis of the gate trenches runs in a first direction parallel to the first main surface;
   forming a source contact groove running in a second direction parallel to the first main surface, the second direction being perpendicular to the first direction, the source contact groove extending along the plurality of gate trenches;
   forming a source region comprising performing a doping process by introducing dopants through a sidewall of the source contact groove;
   filling a sacrificial material in the source contact groove;
   forming components of the logic circuit element after filling the sacrificial material in the source contact groove;
   removing the sacrificial material from the source contact groove after forming the components of the logic circuit element; and
   filling a source conductive material in the source contact groove.

2. The method of claim 1, wherein forming components of the logic circuit comprises forming components of a transistor.

3. The method of claim 2, wherein forming components of the transistor comprises forming a source and a drain region.

4. The method of claim 1, further comprising forming gate contacts each contacting a conductive material in a corresponding one of the gate trenches.

5. The method of claim 4, wherein the gate contacts, contacts to the source conductive material and contact plugs to components of the logic circuit are formed by joint processes.

6. The method of claim 1, further comprising forming field plate trenches, wherein the field plate trenches, the gate trenches and the source contact groove are formed by joint etching processes.

7. The method of claim 6, further comprising forming a field oxide layer to line the field plate trenches, wherein the field oxide layer fills the gate trenches and the source contact groove.

8. The method of claim 1, further comprising forming field plate trenches before forming the gate trenches.

9. The method of claim 8, further comprising forming a field oxide layer before forming the gate trenches.

10. The method of claim 1, further comprising forming a first doped portion of a first conductivity type in a region of the semiconductor substrate before forming the plurality of gate trenches, wherein the gate trenches and the source contact groove are formed in the first doped portion.

11. A method of forming an integrated circuit including a lateral trench transistor and a logic circuit element, the method comprising:
    forming a plurality of gate trenches in a first main surface of a semiconductor substrate, wherein a longitudinal axis of the gate trenches runs in a first direction parallel to the first main surface;
    forming a drain contact groove running in a second direction parallel to the first main surface, the second direction being perpendicular to the first direction, the drain contact groove extending along the plurality of gate trenches;
    forming a drain region comprising performing a doping process by introducing dopants of a first conductivity type through a sidewall of the drain contact groove;
    filling a sacrificial material in the drain contact groove;
    forming components of the logic circuit element after filling the sacrificial material in the drain contact groove;
    removing the sacrificial material from the drain contact groove after forming the components of the logic circuit element; and
    filling a conductive material in the drain contact groove.

12. The method of claim 11, further comprising forming a second doped portion of a second conductivity type in a region of the semiconductor substrate, wherein the gate trenches and the drain contact groove are formed in the second doped portion of the second conductivity type.

13. A semiconductor device comprising an array of transistor cells, each of the transistor cells formed in a semiconductor substrate having a first main surface and comprising:
    a body region disposed between a source region and a drain region in the semiconductor substrate;
    gate trenches extending from the first main surface into the body region, a longitudinal axis of the gate trenches running in a first direction parallel to the first main surface, the source region, the body region, and the drain region being arranged along the first direction;

a source contact groove formed in the semiconductor substrate and running in a second direction parallel to the first main surface, the second direction being perpendicular to the first direction, the source contact groove extending along the gate trenches and being filled with a conductive material to form a source contact arranged in the source contact groove, the source region being arranged adjacent to the source contact groove;

gate electrodes arranged in the gate trenches; and gate contacts, each for connecting one of the gate electrodes to a gate terminal, the gate contacts being spatially separate from each other, wherein the source contact arranged in the source contact groove is separated from the body region by the source region.

14. The semiconductor device of claim 13, wherein the source region and the drain region are of a first conductivity type, wherein the semiconductor substrate further comprises a second doped portion of a second conductivity type, and wherein the source contact groove is arranged in the second doped portion of the second conductivity type.

15. An integrated circuit comprising the semiconductor device of claim 13 and a logic circuit element formed in the semiconductor substrate.

16. The semiconductor device of claim 13, further comprising a drain contact groove formed in the semiconductor substrate and running in the second direction parallel to the first main surface, the drain contact groove being filled with a conductive material to form a drain contact arranged in the drain contact groove, the drain region being arranged adjacent to the drain contact groove.

17. The semiconductor device of claim 13, further comprising a body contact portion disposed beneath the source contact groove and electrically connecting the body region with the source contact.

18. The semiconductor device of claim 17, wherein the body contact portion is disposed at a sidewall of the source contact groove.

19. The semiconductor device of claim 17, wherein the body contact portion extends under the gate trenches.

20. The semiconductor device of claim 17, further comprising a drift zone disposed between the body region and the drain region along the first direction, wherein the body contact portion extends to the drift zone.

* * * * *